United States Patent
Tajiri

(10) Patent No.: US 11,575,244 B2
(45) Date of Patent: Feb. 7, 2023

(54) SEMICONDUCTOR LASER DEVICE

(71) Applicant: ROHM CO., LTD., Kyoto (JP)

(72) Inventor: Hiroyuki Tajiri, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 397 days.

(21) Appl. No.: 16/958,091

(22) PCT Filed: Dec. 27, 2018

(86) PCT No.: PCT/JP2018/048181
§ 371 (c)(1),
(2) Date: Jun. 25, 2020

(87) PCT Pub. No.: WO2019/138909
PCT Pub. Date: Jul. 18, 2019

(65) Prior Publication Data
US 2020/0343685 A1    Oct. 29, 2020

(30) Foreign Application Priority Data

Jan. 12, 2018 (JP) .............................. JP2018-003312

(51) Int. Cl.
*H01S 5/02345* (2021.01)
*H01S 5/026* (2006.01)
(Continued)

(52) U.S. Cl.
CPC ............ *H01S 5/02345* (2021.01); *H01S 5/02* (2013.01); *H01S 5/026* (2013.01); *H01S 5/022* (2013.01)

(58) Field of Classification Search
CPC .............................. H01S 5/0222; H01S 5/0231
See application file for complete search history.

(56) References Cited

U.S. PATENT DOCUMENTS

| | | | |
|---|---|---|---|
| 2013/0272329 A1 | 10/2013 | Auen et al. | |
| 2014/0126917 A1* | 5/2014 | Sato | G02B 6/4265 398/182 |

(Continued)

FOREIGN PATENT DOCUMENTS

| | | |
|---|---|---|
| CN | 102377104 A | 3/2012 |
| CN | 104638509 | 5/2015 |

(Continued)

OTHER PUBLICATIONS

Office Action received in the corresponding Japanese Patent application, dated Aug. 24, 2021, and corresponding machine translation (10 pages).

(Continued)

*Primary Examiner* — Tuan N Nguyen
(74) *Attorney, Agent, or Firm* — Hamre, Schumann, Mueller & Larson, P.C.

(57) ABSTRACT

A semiconductor laser device includes a semiconductor laser element, a base material supporting the semiconductor laser element, and a wiring portion formed on the base material and constituting a conduction path to the semiconductor laser element. The base material includes a mounting face oriented to one side in a thickness direction of the base material and having the semiconductor laser element mounted thereon, while also including an emission part located on one side with respect to the semiconductor laser element in a first direction perpendicular to the thickness direction. Light from the semiconductor laser element is emitted through the emission part to the outside.

13 Claims, 34 Drawing Sheets

(51) Int. Cl.
*H01S 5/02* (2006.01)
*H01S 5/022* (2021.01)

(56) References Cited

U.S. PATENT DOCUMENTS

| 2015/0132001 A1* | 5/2015 | Sato | H04B 10/506 |
| | | | 398/79 |
| 2016/0134388 A1* | 5/2016 | Sato | G02B 6/4284 |
| | | | 398/79 |

FOREIGN PATENT DOCUMENTS

| DE | 10 2015 106 712 A1 | 11/2016 |
| EP | 2 824 778 A1 | 1/2015 |
| JP | 2001-94189 A | 4/2001 |
| JP | 2010-40841 A | 2/2010 |
| JP | 2012-160527 A | 8/2012 |
| JP | 2015-95471 A | 5/2015 |
| JP | 2016-92260 A | 5/2016 |
| JP | 2017-112138 A | 6/2017 |
| JP | 2017-147301 A | 8/2017 |
| WO | 2016/047417 A1 | 3/2016 |
| WO | 2016/171103 A1 | 10/2016 |

OTHER PUBLICATIONS

International Search Report issued in PCT/JP2018/048181, dated Apr. 9, 2019 (2 pages).
Office Action received in the corresponding Chinese Patent application, dated Sep. 23, 2022, and machine translation (16 pages).
Office Action received in the corresponding German Patent application, dated Dec. 14, 2022, and corresponding English translation (22 pages).

* cited by examiner

SEMICONDUCTOR LASER DEVICE

TECHNICAL FIELD

The present disclosure relates to a semiconductor laser device.

BACKGROUND ART

Semiconductor laser devices are widely utilized as a light source device for various types of electronic devices. For example, JP-A-2017-147301 discloses an example of existing semiconductor laser device. The semiconductor laser device disclosed in this document includes a disk-shaped base portion, and a heatsink portion provided on the upper face of the base portion. A semiconductor laser element is mounted on the heatsink portion. Two leads are sticking out from the lower face of the base portion. This semiconductor laser device is mounted on a circuit board, with each of the leads passed through a hole formed in the circuit board.

PRIOR ART DOCUMENT

Patent Literature

Patent Literature 1: JP-A-2017-147301

SUMMARY OF THE INVENTION

Problems to be Solved by the Invention

Apart from the foregoing semiconductor laser device, there are cases where a semiconductor laser device designed for surface mounting is required, depending on the type of the electronic device.

In light of the above, an object of the present disclosure is to propose a semiconductor laser device that can be surface-mounted.

Means for Solving the Problem

According to an aspect of the present disclosure, there is provided a semiconductor laser device including: a semiconductor laser element; a base material supporting the semiconductor laser element; and a wiring portion formed on the base material and constituting a conduction path to the semiconductor laser element. The base material includes: a mounting face oriented to one side in a thickness direction of the base material and having the semiconductor laser element mounted thereon; and an emission part located on one side with respect to the semiconductor laser element in a first direction perpendicular to the thickness direction. It is arranged that light from the semiconductor laser element is emitted out through the emission part.

Advantage of the Invention

The semiconductor laser device according to the present disclosure can be surface-mounted.

Other features and advantages of the present disclosure will become more apparent, through the description given below with reference to the accompanying drawings.

MODE FOR CARRYING OUT THE INVENTION

Figure 1:
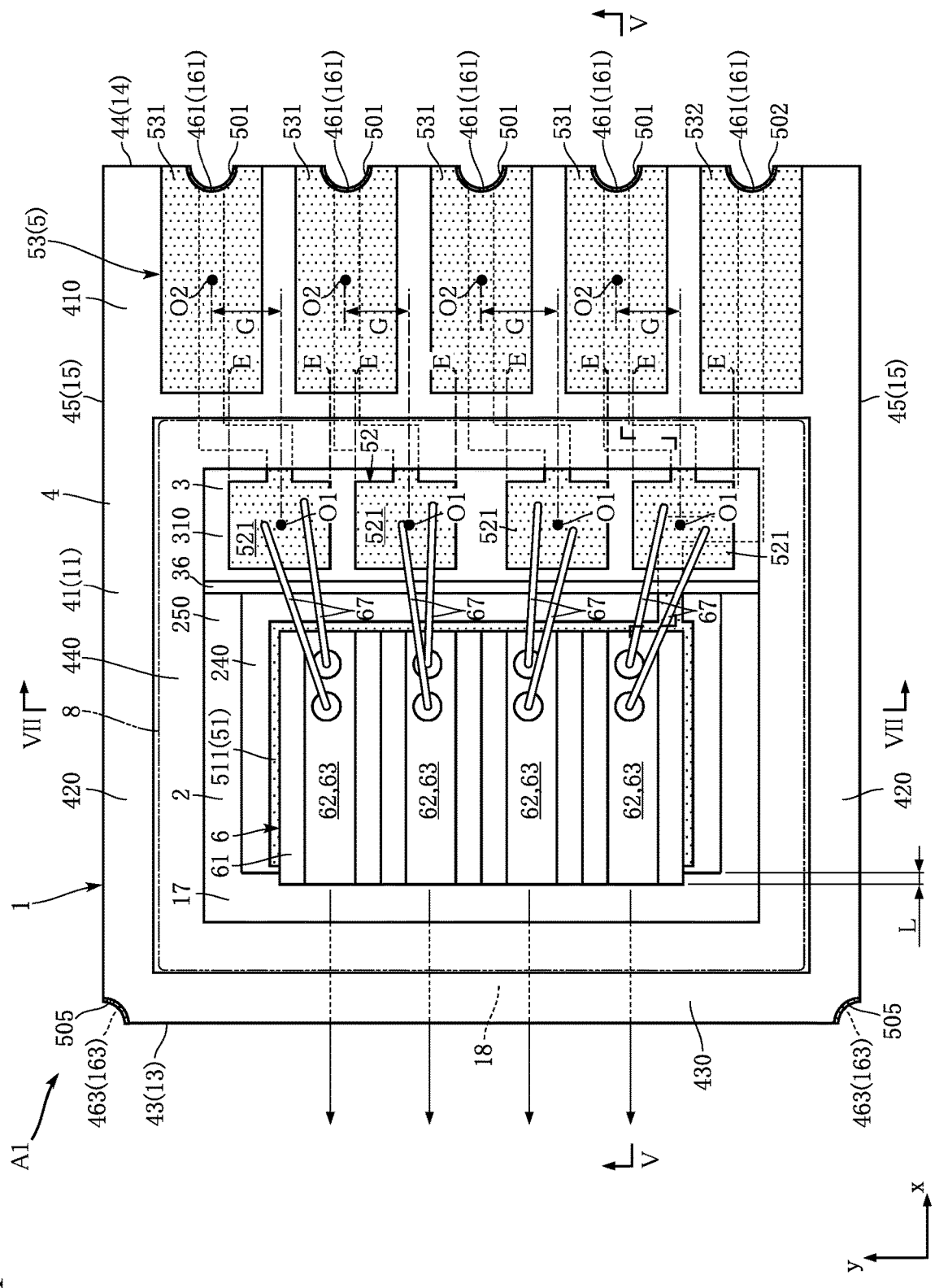
FIG. 1 is a plan view showing a semiconductor laser device according to a first embodiment.

Hereafter, exemplary embodiments of the present disclosure will be described in detail, with reference to the drawings.

FIG. 1 to FIG. 10 illustrate a semiconductor laser device A1 according to a first embodiment of the present disclosure. The semiconductor laser device A1 includes a base material 1, a wiring portion 5, a semiconductor laser element 6, a plurality of through wirings 69, a first cover 7, and a second cover 8.

In the description given hereunder, a z-direction corresponds to a thickness direction of the base material 1. An x-direction corresponds to a first direction, and a y-direction corresponds to a second direction. Referring to the z-direction, the upper side in the drawing corresponds to "one side", and the lower side corresponds to "the other side". Referring to the x-direction, a term "front side" may be used to represent the one side, and a term "rear side" may be used to represent the other side. It should be noted, however, that the terms "one side", "the other side", "front", and "rear" are used merely for the sake of convenience of the description, and in no way intended to limit the configuration of the semiconductor laser device according to the present disclosure.

The terms "first", "second", "third", and so forth in the present disclosure are merely for the purpose of distinction of elements from one another, and in no way intended to specify an order with respect to the elements accompanied with these terms.

The base material 1 supports the semiconductor laser element 6. At least the surface of the base material 1 is formed of an insulative material. For example as shown in FIG. 1 to FIG. 5, the base material 1 includes an obverse face 11, a reverse face 12, a front end face 13, a rear end face 14, a pair of side faces 15, an opening 17, an emission part 18, a plurality of rear grooves 161, a plurality of front grooves 163, and a front recess 171. The dimensions of the base material 1 are, for example, approximately 2.0 mm to 7.0 mm in the x-direction, approximately 1.5 mm to 7.0 mm in the y-direction, and approximately 0.7 mm to 2.5 mm in the z-direction. However, the size or shape of the is not limited to such examples.

The obverse face 11 is oriented to one side (upper side) in the z-direction. In this embodiment, the obverse face 11 serves as a mounting face. In the illustrated example, the obverse face 11 is perpendicular to the z-direction. The obverse face 11 is generally rectangular.

The reverse face 12 is located on the opposite side of the obverse face 11, and oriented to the other side (lower side) in the z-direction. In the illustrated example, the reverse face 12 is perpendicular to the z-direction. The reverse face 12 is generally rectangular.

The front end face 13 is oriented to one side (front side) in the x-direction, and continuous with the obverse face 11 and the reverse face 12. In the illustrated example, the front end face 13 is perpendicular to the x-direction.

The rear end face 14 is oriented to the other side (rear side) in the x-direction, and continuous with the obverse face 11 and the reverse face 12. In the illustrated example, the rear end face 14 is perpendicular to the x-direction.

The pair of side faces 15 are each continuous with the obverse face 11 and the reverse face 12, and also with the front end face 13 and the rear end face 14. The pair of side faces 15 are spaced from each other in the y-direction. In the illustrated example, the side faces 15 are each perpendicular to the y-direction, and generally rectangular.

The opening 17 opens the inner space defined by the base material 1 to one side (upper side) in the z-direction. In the illustrated example, the opening 17 is generally rectangular as viewed in the z-direction, in other words in a plan view (see FIG. 10). The opening 17 is biased to one side (front side) in the x-direction. Because of the presence of the opening 17, the obverse face 11 has an annular rectangular shape (closed frame shape), as viewed in the z-direction.

The emission part 18 may be a port for emitting therethrough the laser light from the semiconductor laser element 6, to one side (front side) in the x-direction. In the illustrated example, the inner space defined by the base material 1 is opened toward one side (front side) in the x-direction, by the emission part 18. The emission part 18 is, for example, rectangular as viewed in the x-direction (see FIG. 2). Because of the presence of the emission part 18, the front end face 13 has an annular rectangular shape, as viewed in the x-direction.

Figure 3:
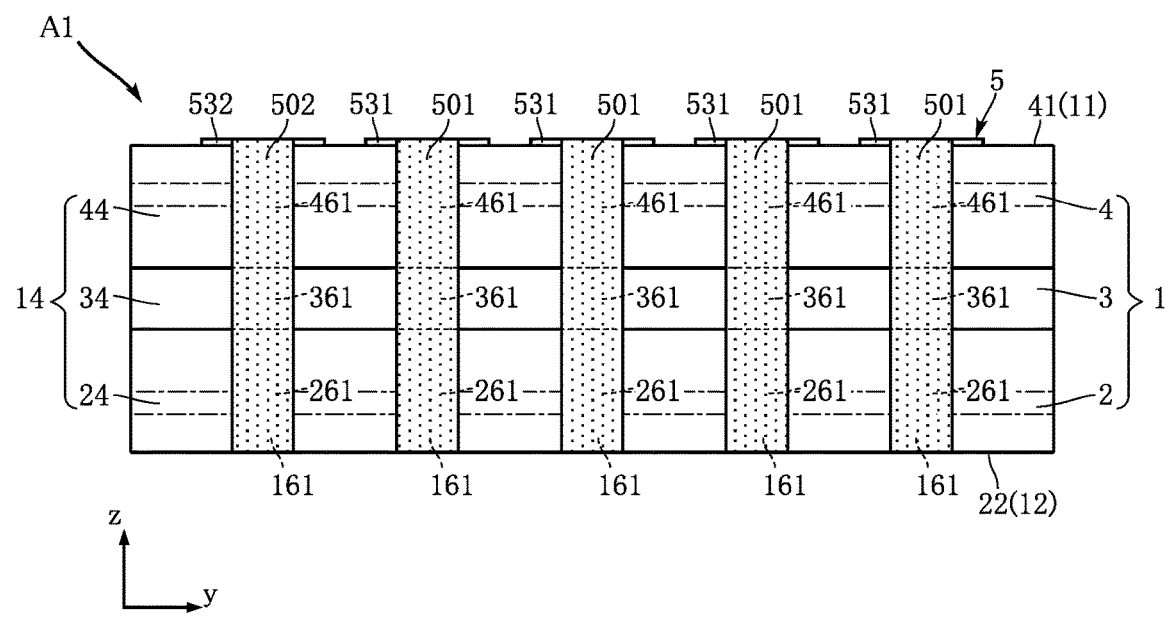
FIG. 3 is a side view showing the semiconductor laser device according to the first embodiment.
Figure 4:
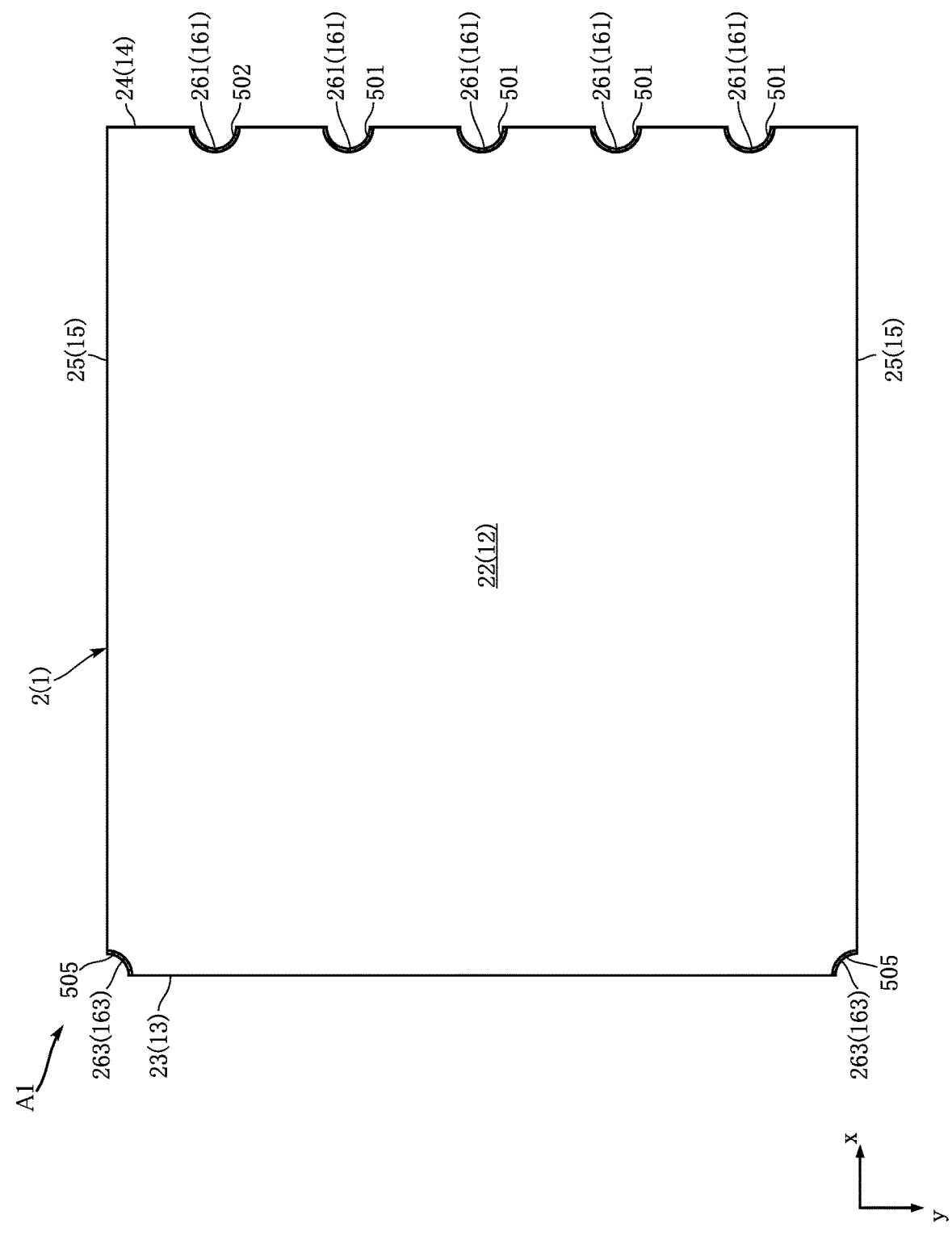
FIG. 4 is a bottom view showing the semiconductor laser device according to the first embodiment.

The plurality of rear grooves 161 are each recessed from the rear end face 14 (see FIG. 1), and extend in the z-direction (see FIG. 3). The rear grooves 161 each reach the obverse face (mounting face) 11. In the illustrated example, each of the rear grooves 161 also reaches the reverse face 12. Although the rear grooves 161 has a semicircular cross-sectional shape in the illustrated example, the present disclosure is not limited to such a configuration. The plurality of rear grooves 161 are spaced from each other, in the y-direction.

As shown in FIG. 1, the plurality of front grooves 163 are each formed at the boundary between one of the pair of side faces 15 and the front end face 13. The front grooves 163 each extend in the z-direction, so as to reach the obverse face 11 and the reverse face 12. Although the rear grooves 161 each have a quarter-circular cross-sectional shape in the illustrated example, the present disclosure is not limited to such a configuration.

Figure 2:
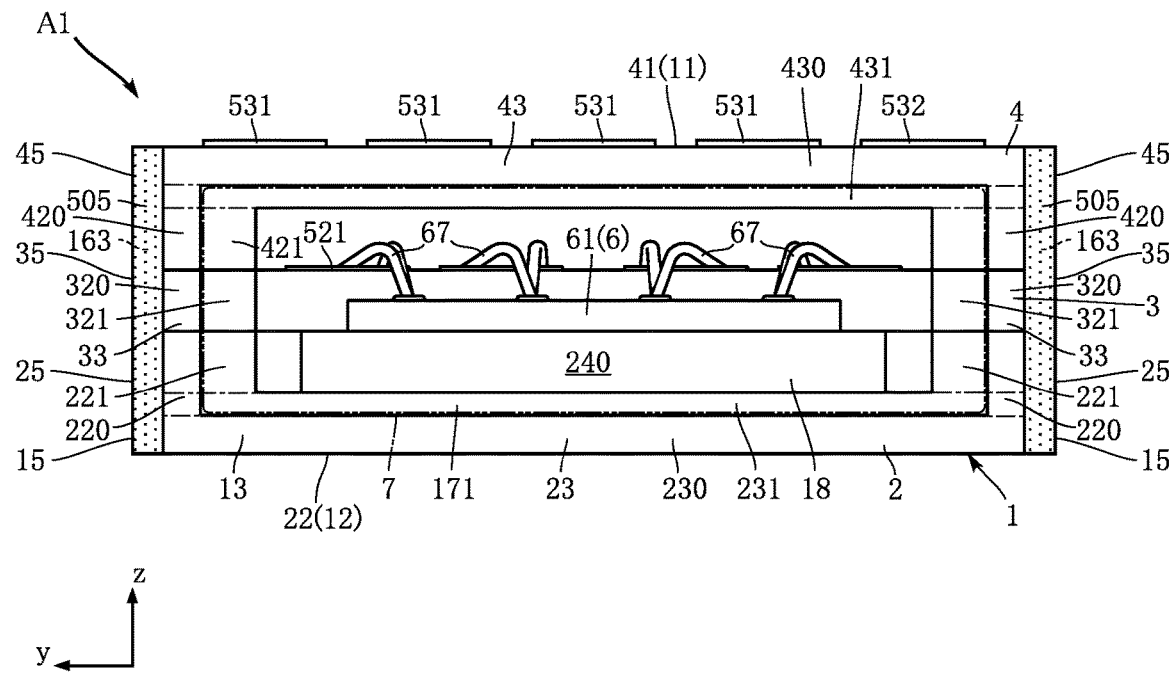
FIG. 2 is a front view showing the semiconductor laser device according to the first embodiment.
Figure 5:
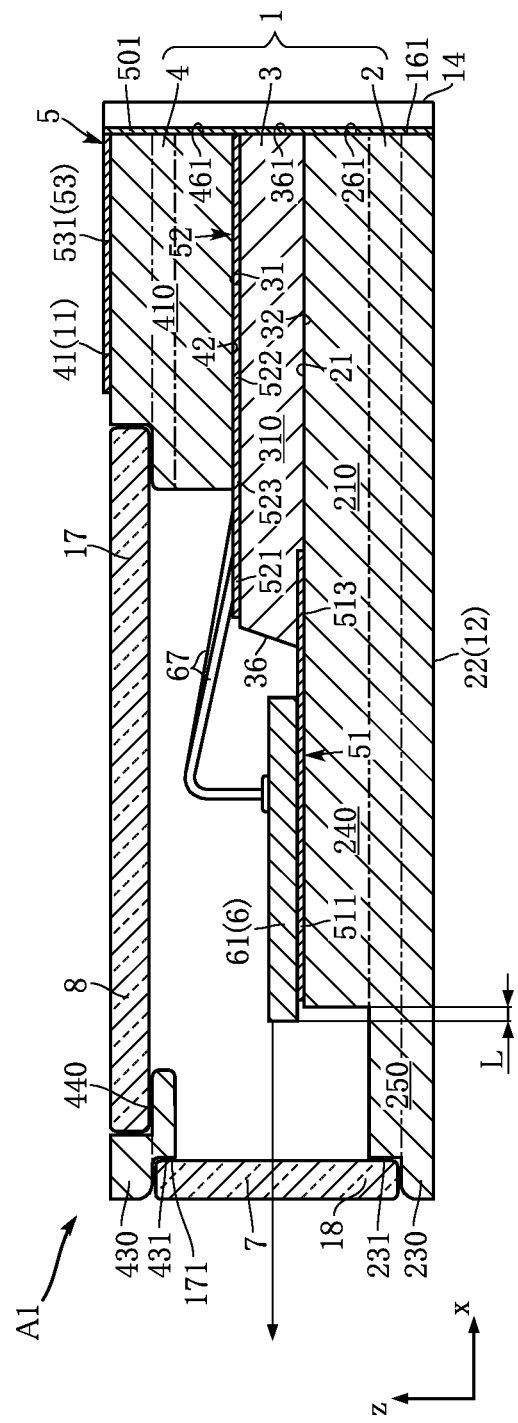
FIG. 5 is a cross-sectional view taken along a line V-V in FIG. 1.
Figure 6:
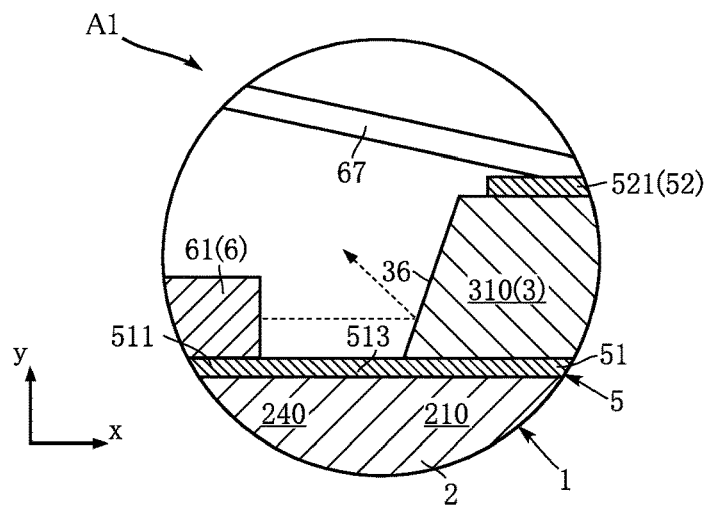
FIG. 6 is an enlarged cross-sectional view showing a part of the semiconductor laser device according to the first embodiment.
Figure 7:
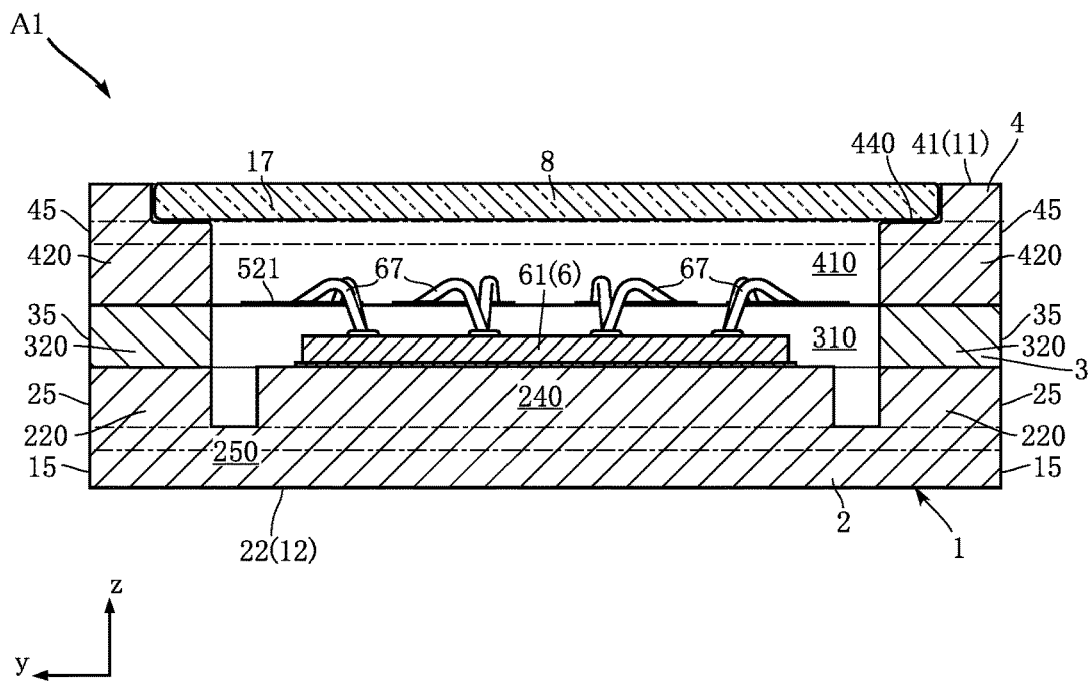
FIG. 7 is a cross-sectional view taken along a line VII-VII in FIG. 1.

As shown in FIG. 2 and FIG. 5, the front recess 171 is formed so as to recede to the other side (rear side) in the x-direction from the front end face 13, and extend so as to surround the emission part 18. The front recess 171 has an annular rectangular shape, as viewed in the x-direction. The front recess 171 is used to attach the first cover 7.

As shown in FIG. 3, the base material 1 includes a plurality of layers. In the illustrated example, the base material 1 includes a first layer 2, a second layer 3, and a third layer 4. The first layer 2, the second layer 3, and the third layer 4 are stacked in the z-direction. Examples of the material of the first layer 2, the second layer 3, and the third layer 4 include, but are not limited to, a ceramic such as alumina or aluminum nitride. Here, each of the layers may be composed of a plurality of ceramic layers. In FIG. 2, FIG. 3, FIG. 5, and FIG. 7, dash-dot lines indicate the boundaries between the ceramic layers located adjacent to each other.

The first layer 2 is the lowermost layer in the z-direction. The first layer 2 includes a first obverse face 21, a first reverse face 22, a first front end face 23, a first rear end face 24, a pair of first side faces 25, a first main portion 210, a pair of first side frames 220, a first front frame 230, a pedestal portion 240, a bottom portion 250, a plurality of first rear grooves 261, and a plurality of first front grooves 263.

The first obverse face 21 is oriented upward in the z-direction. In this embodiment, the first obverse face 21 serves as a mounting face. In the illustrated example, the first obverse face 21 is perpendicular to the z-direction.

The first reverse face 22 is on the opposite side of the first obverse face 21, and oriented downward in the z-direction. In the illustrated example, the first reverse face 22 is perpendicular to the z-direction. The first reverse face 22 constitutes the reverse face 12.

The first front end face 23 is oriented to one side (front side) in the x-direction, and continuous with the first obverse face 21 and the first reverse face 22. In the illustrated example, the first front end face 23 is perpendicular to the x-direction. The first front end face 23 constitutes a part of the front end face 13.

The first rear end face 24 is oriented to the other side (rear side) in the x-direction, and continuous with the first obverse face 21 and the first reverse face 22. In the illustrated example, the first rear end face 24 is perpendicular to the x-direction. The first rear end face 24 constitutes a part of the rear end face 14.

The pair of first side faces 25 are each continuous with the first obverse face 21 and the first reverse face 22, and also with the first front end face 23 and the first rear end face 24. The pair of first side faces 25 are each oriented in the y-direction. In the illustrated example, the first side faces 25 are perpendicular to the y-direction. The first side faces 25 each constitute a part of the side face 15.

The first main portion 210 is a portion of the first layer 2 located on the rear side in the x-direction. In the illustrated example, the first main portion 210 is generally rectangular, as viewed in the z-direction. The thickness of the first main portion 210 is equal to the maximum thickness of the first layer 2.

The pair of first side frames 220 extend to the front side in the x-direction, from the respective sides of the first main portion 210 in the y-direction. The thickness of the first side frame 220 is equal to the maximum thickness of the first layer 2.

The first front frame 230 is continuous with the respective end portions of the pair of first side frames 220 on one side in the x-direction, and extends in the y-direction. The pair of first side frames 220 and the first front frame 230 constitute a frame-shaped portion. The first front frame 230 includes a recess 231. The recess 231 corresponds to a portion of the first front frame 230 where the size thereof in the z-direction is reduced, and constitutes a part of the front recess 171.

The pedestal portion 240 extends to one side (front side) in the x-direction from the first main portion 210, and is generally rectangular as viewed in the z-direction, in the illustrated example. The pedestal portion 240 is spaced from the pair of first side frames 220 and the first front frame 230. On the pedestal portion 240, the semiconductor laser element 6 is mounted.

The bottom portion 250 is located on the other side (lower side) in the z-direction, with respect to the first obverse face 21. The bottom portion 250 is located in a region surrounded by the pair of first side frames 220, the first front frame 230, and the pedestal portion 240, as viewed in the z-direction. The bottom portion 250 is thinner than the maximum thickness of the first layer 2 in the z-direction.

The plurality of first rear grooves 261 are each recessed from the first rear end face 24, and each extend in the z-direction. The first rear grooves 261 each reach the first obverse face 21 and the first reverse face 22. The cross-sectional shape of the first rear grooves 261 is not specifically limited. In the illustrated example, the first rear grooves 261 each have a semicircular cross-sectional shape. The plurality of first rear grooves 261 are spaced from each other in the y-direction. The plurality of first rear grooves 261 each constitute a part of one of the plurality of rear grooves 161.

The plurality of first front grooves 263 are each formed at the boundary between one of the pair of first side faces 25 and the first front end face 23. The first front grooves 263 each extend in the z-direction, so as to reach the first obverse face 21 and the first reverse face 22. The cross-sectional shape of the first front grooves 263 is not specifically limited. In the illustrated example, the first front grooves 263 each have a quarter-circular cross-sectional shape. The plurality of first front grooves 263 each constitute a part of one of the plurality of front grooves 163.

The second layer 3 is stacked on one side (upper side) of the first layer 2 in the z-direction. The second layer 3 includes a second obverse face 31, a second reverse face 32, a second front end face 33, a second rear end face 34, a pair of second side faces 35, an inner end face 36, a second main portion 310, a pair of second side frames 320, a plurality of second rear grooves 361, and a plurality of second front grooves 363.

The second obverse face 31 is oriented to one side (upper side) in the z-direction. In the illustrated example, the second obverse face 31 is perpendicular to the z-direction.

The second reverse face 32 is oriented to the other side (lower side) in the z-direction, opposite to the side to which the second obverse face 31 is oriented, and opposed to the first obverse face 21 of the first layer 2. In the illustrated example, the second reverse face 32 is perpendicular to the z-direction.

The second front end face 33 is oriented to one side (front side) in the x-direction, and continuous with the second obverse face 31 and the second reverse face 32. In the illustrated example, the second front end face 33 is perpendicular to the x-direction. The second front end face 33 constitutes a part of the front end face 13. The second front end face 33 includes two regions spaced from each other in the y-direction.

The second rear end face 34 is oriented to the other side (rear side) in the x-direction, and continuous with the second obverse face 31 and the second reverse face 32. In the illustrated example, the second rear end face 34 is perpendicular to the x-direction. The second rear end face 34 constitutes a part of the rear end face 14.

The pair of second side faces 35 are each continuous with the second obverse face 31 and the second reverse face 32, and also with the second front end face 33 and the second rear end face 34. The pair of second side faces 35 are each oriented in the y-direction. In the illustrated example, the second side faces 35 are perpendicular to the y-direction. The second side faces 35 each constitute a part of the side face 15.

The second main portion 310 is a portion of the second layer 3 located on the other side (rear side) in the x-direction. In the illustrated example, the second main portion 310 is generally rectangular, as viewed in the z-direction. The thickness of the second main portion 310 is equal to the maximum thickness of the second layer 3.

The inner end face 36 is located on one side (front side) of the second main portion 310 in the x-direction. The inner end face 36 is inclined with respect to the z-direction, so as to be shifted to one side (front side, to the left in FIG. 6) in the x-direction, proceeding along from one side (upper side in FIG. 6) toward the other side (lower side in FIG. 6) in the z-direction.

The pair of second side frames 320 extend to one side (front side) in the x-direction, from the respective sides of the second main portion 310 in the y-direction. The thickness of the second side frame 320 is equal to the maximum thickness of the second layer 3.

The pair of second side frames 320 each include a recess 321. The recess 321 is formed so as to recede to the other side (rear side) in the x-direction, from the second front end face 33 of the second side frame 320. The recess 321 is located on the inner side in the y-direction. The pair of recesses 321 constitute a part of the front recess 171.

The plurality of second rear grooves 361 are each recessed from the second rear end face 34, and each extend in the z-direction. The second rear grooves 361 each reach the second obverse face 31 and the second reverse face 32. The cross-sectional shape of the second rear grooves 361 is not specifically limited. In the illustrated example, the second rear grooves 361 each have a semicircular cross-sectional shape. The plurality of second rear grooves 361 are spaced from each other in the y-direction. The plurality of second rear grooves 361 each constitute a part of one of the plurality of rear grooves 161.

The plurality of second front grooves 363 are each formed at the boundary between one of the pair of second side faces 35 and the second front end face 33. The second front grooves 363 each extend in the z-direction, so as to reach the second obverse face 31 and the second reverse face 32. The cross-sectional shape of the second front grooves 363 is not specifically limited. In the illustrated example, the second front grooves 363 each have a quarter-circular cross-sectional shape. The plurality of second front grooves 363 each constitute a part of one of the plurality of front grooves 163.

The third layer 4 is the uppermost layer in the z-direction. The third layer 4 is stacked on one side (upper side) of the second layer 3, in the z-direction. The third layer 4 includes a third obverse face 41, a third reverse face 42, a third front end face 43, a third rear end face 44, a pair of third side faces 45, a third main portion 410, a pair of third side frames 420, a third front frame 430, a plurality of third rear grooves 461, and a plurality of third front grooves 463.

The third obverse face 41 is oriented to one side (upper side) in the z-direction. In the illustrated example, the third obverse face 41 is perpendicular to the z-direction. In this embodiment, the third obverse face 41 constitutes the obverse face 11.

The third reverse face 42 is oriented to the other side (lower side) in the z-direction, opposite to the side to which the third obverse face 41 is oriented, and opposed to the second obverse face 31 of the second layer 3. In the illustrated example, the third reverse face 42 is perpendicular to the z-direction.

The third front end face 43 is oriented to one side (front side) in the x-direction, and continuous with the third obverse face 41 and the third reverse face 42. In the illustrated example, the third front end face 43 is perpendicular to the x-direction. The third front end face 43 constitutes a part of the front end face 13.

The third rear end face 44 is oriented to the other side (rear side) in the x-direction, and continuous with the third obverse face 41 and the third reverse face 42. In the illustrated example, the third rear end face 44 is perpendicular to the x-direction. The third rear end face 44 constitutes a part of the rear end face 14.

The pair of third side faces 45 are each continuous with the third obverse face 41 and the third reverse face 42, and also with the third front end face 43 and the third rear end face 44. The pair of third side faces 45 are each oriented in the y-direction. In the illustrated example, the third side faces 45 are perpendicular to the y-direction. The third side faces 45 each constitute a part of the side face 15.

The third main portion 410 is a portion of the third layer 4 located on the other side (rear side) in the x-direction. In the illustrated example, the third main portion 410 is generally rectangular, as viewed in the z-direction. The thickness of the third main portion 410 is equal to the maximum thickness of the second layer 3.

The pair of third side frames 420 extend to one side (front side) in the x-direction, from the respective sides of the third main portion 410 in the y-direction.

The third front frame 430 is continuous with the respective end portions of the pair of third side frames 420, on one side in the x-direction, and extends in the y-direction. The pair of third side frames 420 and the third front frame 430 constitute a frame-shaped portion. As shown in FIG. 5, the third front frame 430 includes a recess 431. The recess 431 is formed so as to recede to the other side (rear side) in the x-direction from the third front end face 43, and constitutes a part of the front recess 171.

The plurality of third rear grooves 461 are each recessed from the third rear end face 44, and each extend in the z-direction. The third rear grooves 461 each reach the third obverse face 41 and the third reverse face 42. The cross-sectional shape of the third rear grooves 461 is not specifically limited. In the illustrated example, the third rear grooves 461 each have a semicircular cross-sectional shape. The plurality of third rear grooves 461 are spaced from each other in the y-direction. The plurality of third rear grooves 461 each constitute a part of one of the plurality of rear grooves 161.

The plurality of third front grooves 463 are each formed at the boundary between one of the pair of third side faces 45 and the third front end face 43. The third front grooves 463 each extend in the z-direction, so as to reach the third obverse face 41 and the third reverse face 42. The cross-sectional shape of the third front grooves 463 is not specifically limited. In the illustrated example, the third front grooves 463 each have a quarter-circular cross-sectional shape. The plurality of third front grooves 463 each constitute a part of one of the plurality of front grooves 163.

In this embodiment, the third layer 4 includes the opening 17, and also the annular recess 440. The annular recess 440 corresponds to the portion of the third layer 4 surrounding the opening 17, recessed to the other side (lower side) in the z-direction, from the third obverse face 41 (obverse face 11). The annular recess 440 has an annular rectangular shape, as viewed in the z-direction. The annular recess 440 is used to attach the second cover 8.

The wiring portion 5 is formed on the base material 1, to constitute a conduction path to the semiconductor laser element 6. As shown in FIG. 1 to FIG. 3 and FIG. 5 to FIG. 10, the wiring portion 5 includes a first wiring portion 51, a second wiring portion 52, a third wiring portion 53, a plurality of rear communicating portions 501, and a plurality of front portions 505, in this embodiment. The wiring portion 5 is formed of a material having appropriate conductivity, for example by plating or pasting. Examples of the material of the wiring portion 5 include Cu, Ni, Ti, and Au. In a portion of the wiring portion 5 where solder is to be applied, a surface layer formed of Sn may be provided.

The first wiring portion 51 is formed on the first layer 2 of the base material 1. In this embodiment, the first wiring portion 51 includes an element mounting section 511, a first strip section 512, and a first connecting section 513.

The element mounting section 511 is formed on the first obverse face 21 of the pedestal portion 240 of the first layer 2 in the base material 1. The element mounting section 511 is where the semiconductor laser element 6 is to be mounted. In the illustrated example, the element mounting section 511 is generally rectangular as viewed in the z-direction, and covers a majority of the pedestal portion 240.

Figure 8:
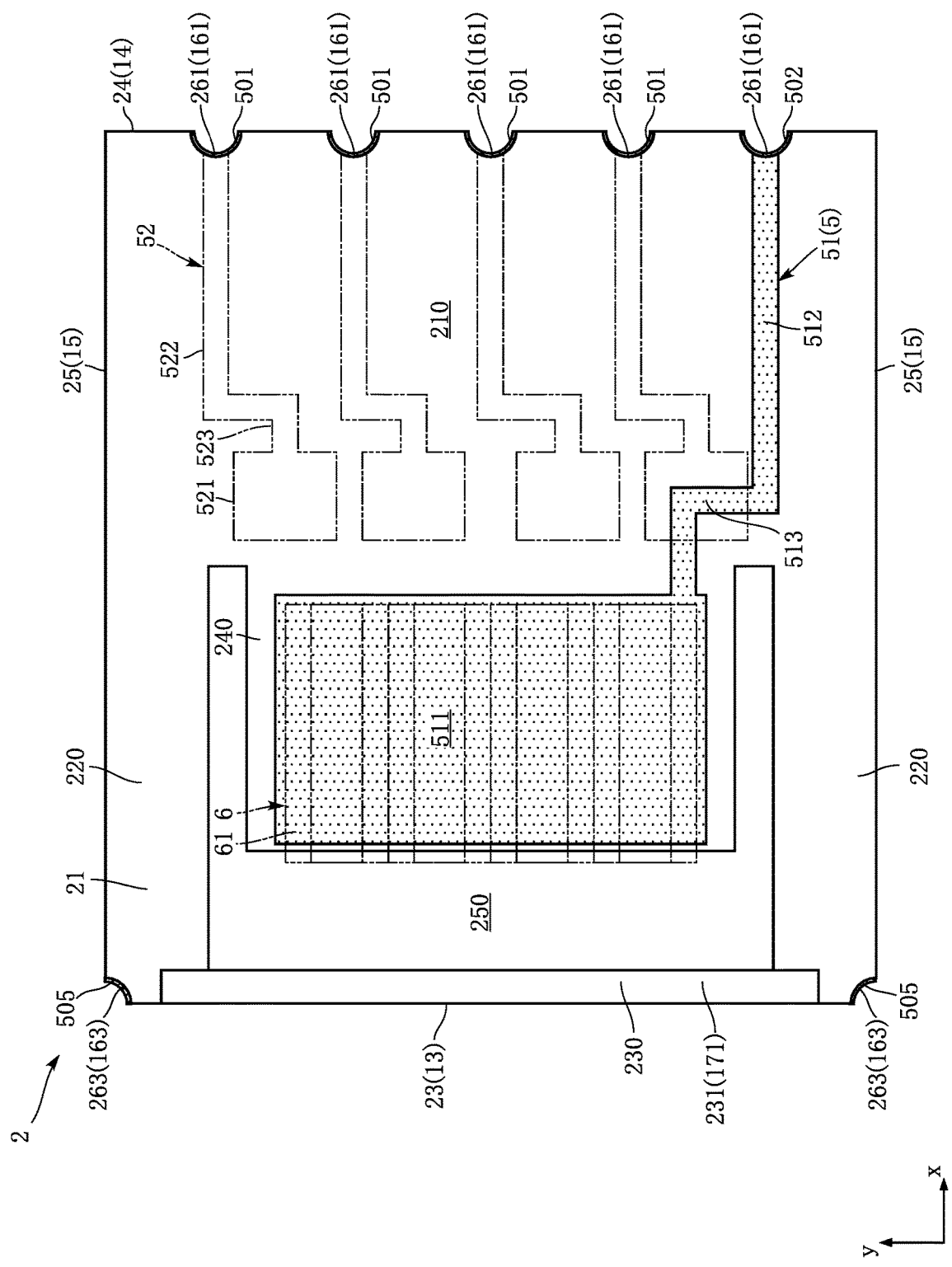
FIG. 8 is a plan view showing a base material of the semiconductor laser device according to the first embodiment.

The first strip section 512 is formed on the first main portion 210 of the first layer 2, so as to reach the lowermost one of the plurality of first rear grooves 261 in the y-direction, in FIG. 8. The first strip section 512 extends along the x-direction, from the mentioned first rear groove 261.

The first connecting section 513 connects between the element mounting section 511 and the first strip section 512. The shape and size of the first connecting section 513 are not specifically limited. In the illustrated example, the first connecting section 513 has a shape having two bent portions.

The second wiring portion 52 is formed on the second layer 3 of the base material 1. The second wiring portion 52 includes a plurality of wire bonding sections 521, a plurality of second strip sections 522, and a plurality of second connecting sections 523.

To each of the plurality of wire bonding sections 521, a plurality of wires 67 are connected. In this embodiment, the plurality of wire bonding sections 521 are aligned in the y-direction, and formed on one side (front side) of the second main portion 310 in the x-direction. The shape of the wire bonding sections 521 is not specifically limited. In the illustrated example, the wire bonding sections 521 are rectangular. As shown in FIG. 1, the plurality of wire bonding sections 521 are exposed from the third layer 4, as viewed in the z-direction.

Figure 9:
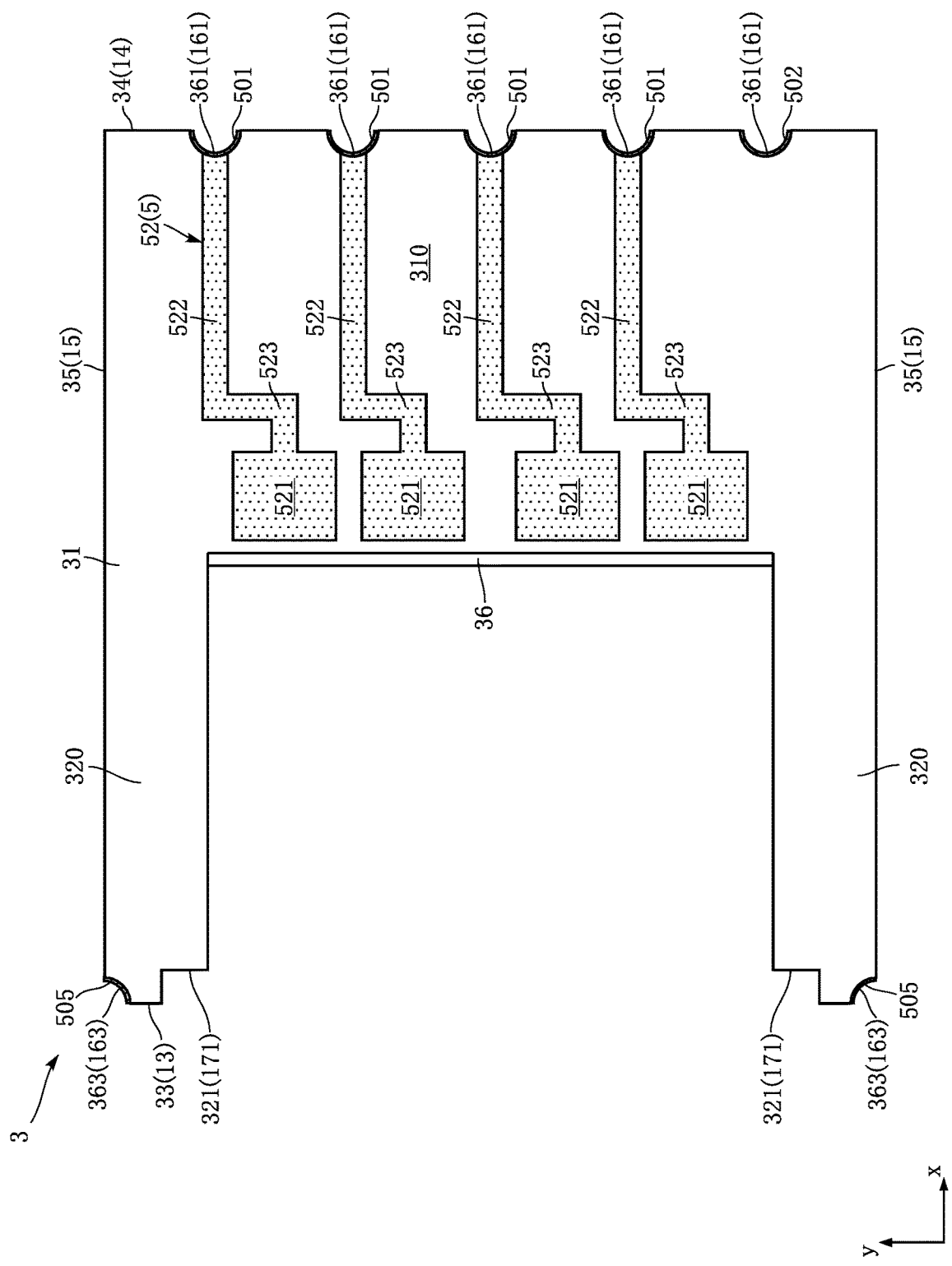
FIG. 9 is a plan view showing the base material of the semiconductor laser device according to the first embodiment.
Figure 10:
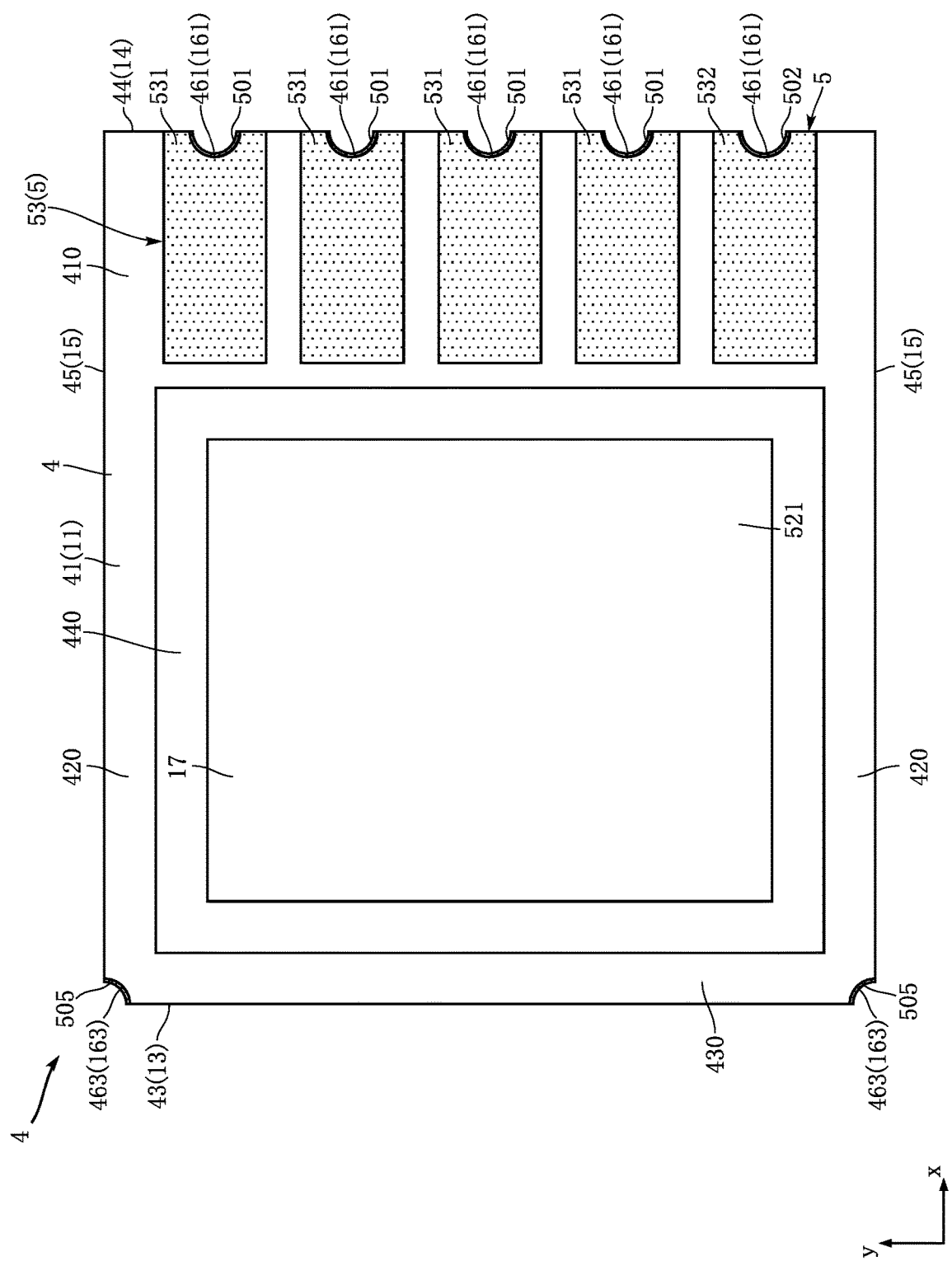
FIG. 10 is a plan view showing the base material of the semiconductor laser device according to the first embodiment.

The plurality of second strip sections 522 are formed on the second main portion 310 of the second layer 3, so as to respectively reach upper four of the plurality of second rear grooves 361 in the y-direction, in FIG. 9. The second strip sections 522 each extend along the x-direction, from the corresponding second rear groove 361. Here, as shown in FIG. 8, the first strip section 512 and the plurality of second strip sections 522 are spaced from each other in the y-direction, as viewed in the z-direction.

The plurality of second connecting sections 523 each connect between corresponding ones of the plurality of wire bonding sections 521 and the plurality of second strip section 522. The shape and size of the second connecting section 523 is not specifically limited. In the illustrated example, the second connecting section 523 has a shape having two bent portions.

The third wiring portion 53 is formed on the third layer 4 of the base material 1. The third wiring portion 53 includes a plurality of mounting terminal sections 531 and a mounting terminal section 532.

The plurality of mounting terminal sections 531 are formed on the third main portion 410 of the third layer 4, and aligned in the y-direction with a spacing between each other. The plurality of mounting terminal sections 531 respectively reach upper four of the plurality of third rear grooves 461 in the y-direction in FIG. 10. The mounting terminal sections 531 each extend along the x-direction, from the corresponding third rear groove 461. The mounting terminal sections 531 are larger in size in the y-direction, than the second strip section 522. The plurality of mounting terminal sections 531 are, for example, anode electrodes.

The mounting terminal section 532 is formed on the third main portion 410 of the third layer 4. The mounting terminal section 532 reaches the lowermost one of the plurality of third rear grooves 461 in the y-direction, in FIG. 10. The mounting terminal section 532 extends along the x-direction, from the mentioned third rear groove 461. The mounting terminal section 532 is larger in size in the y-direction, than the first strip section 512. The plurality of mounting terminal sections 531 and the mounting terminal section 532 are spaced from each other in the y-direction. The mounting terminal section 532 is, for example, a cathode electrode.

In this embodiment, as shown in FIG. 1, a center O1 of the wire bonding sections 521 and a center O2 of the mounting terminal section 531, which are electrically continuous with each other, are shifted in the y-direction from each other by a gap G, as viewed in the z-direction. The plurality of gaps G shown in FIG. 1 may be the same as, or different from, each other. In addition, imaginary lines E each extended from the edge of the wire bonding sections 521 in the y-direction intersects with the mounting terminal section 531.

As shown in FIG. 3, the plurality of rear communicating portions 501 are formed so as to respectively cover four of the plurality of rear grooves 161 of the base material 1 on the right, in FIG. 3. In this embodiment, the rear communicating portions 501 each reach the end portion of the rear groove 161 on one side (upper end) in the z-direction. In the illustrated example, the rear communicating portions 501 also reach the end portion of the corresponding rear groove 161, on the other side (lower end) in the z-direction. The rear communicating portions 501 are each in contact with the second strip section 522 of the second wiring portion 52, and the mounting terminal section 531 of the third wiring portion 53, thus to be electrically continuous therewith. Accordingly, the wire bonding sections 521 is electrically continuous with the mounting terminal section 531, via the second connecting section 523, the second strip section 522, and the rear communicating portion 501.

The rear communicating portion 502 is formed so as to cover the left-end one of the plurality of rear grooves 161 of the base material 1, in FIG. 3. In this embodiment, the rear communicating portion 502 reaches the end portion of the rear groove 161, on one side (upper end) in the z-direction. In the illustrated example, the rear communicating portion 502 also reaches the end portion of the rear groove 161, on the other side (lower end) in the z-direction. The rear communicating portion 502 is in contact with the first strip section 512 of the first wiring portion 51, and the mounting terminal section 532 of the third wiring portion 53, thus to be electrically continuous therewith. Accordingly, the element mounting section 511 is electrically continuous with the mounting terminal section 532, via the first connecting section 513, the first strip section 512, and the rear communicating portion 502.

As shown in FIG. 2, the plurality of front portions 505 respectively cover the plurality of front grooves 163. In the illustrated example, the front portions 505 covers the entirety of the front groove 163, and reaches both end portions of the front groove 163 in the z-direction. The front portions 505 are not in contact with the first wiring portion 51, the second wiring portion 52, and the third wiring portion 53, and are therefore not electrically continuous with those portions.

The semiconductor laser element 6 emits laser light of a predetermined wavelength. The specific configuration of the semiconductor laser element 6 is not limited. In this embodiment, the semiconductor laser element 6 includes a semiconductor layer 61, a plurality of waveguides 62 and a plurality of electrodes 63.

The semiconductor layer 61 includes a plurality of layers formed of a semiconductor material, stacked on each other. For example, the semiconductor layer 61 includes an n-clad layer, a p-clad layer, and an active layer interposed therebetween. Owing to the recombination of electrons and holes in the active layer, light is generated.

The plurality of waveguides 62 repeatedly reflect the light generated in the active layer in the x-direction, to thereby generate the laser light of a predetermined wavelength. In this embodiment, the plurality of waveguides 62 are aligned in the y-direction with a spacing between each other, and each extend in the x-direction. The semiconductor laser element 6 is of a multi beam type, and capable of individually emitting the laser light from each of the waveguides 62, in other words independently from other waveguides.

The plurality of electrodes 63 are respectively provided for the plurality of waveguides 62, and aligned in the y-direction with a spacing from each other. A plurality of wires 67 are connected to the plurality of electrodes 63. In the illustrated example, a plurality of wires 67 are connected to each of the electrodes 63, to supply a larger current thereto.

In this embodiment, a non-illustrated electrode, provided on the lower face of the semiconductor layer 61 of the semiconductor laser element 6, is conductively bonded to the element mounting section 511, via a non-illustrated conductive bonding material such as a silver paste. Accordingly, the semiconductor laser element 6 is mounted on the first obverse face 21 of the pedestal portion 240. As shown in FIG. 1 and FIG. 5, the end portion of the semiconductor laser element 6 on one side in the x-direction sticks out from the pedestal portion 240 to the one side in the x-direction, by a length L. Such a configuration is advantageous in preventing interference between the light from the semiconductor laser element 6 and the pedestal portion 240, and is therefore adopted also in the subsequent drawings. However, in the case where the interference of the light from the semiconductor laser element 6 is permissible, the semiconductor laser element 6 may be formed so as not to stick out from the pedestal portion 240, for example such that the end portion of the semiconductor laser element 6 on one side in the x-direction, and the end portion of the pedestal portion 240 on one side in the x-direction become generally flush with each other.

The number of waveguides 62 to be provided in the semiconductor laser element 6 is not specifically limited. In the illustrated example, the semiconductor laser element 6 includes four waveguides 62. Correspondingly, the semiconductor laser element 6 includes four electrodes 63. In addition, the second wiring portion 52 includes four wire bonding sections 521, four second strip sections 522, and four second connecting sections 523. The base material 1 includes five rear grooves 161, and the wiring portion 5 includes four rear communicating portions 501 and one rear communicating portion 502. Further, the third wiring portion 53 includes four mounting terminal sections 531 and one mounting terminal section 532.

The first cover 7, covering the emission part 18, is formed of a material that transmits the light from the semiconductor laser element 6. In this embodiment, the first cover 7 is, for example, made of transparent glass. A predetermined coating may be applied to the first cover 7, to improve emission efficiency. In the illustrated example, the first cover 7 is rectangular as viewed in the x-direction, and accommodated in the front recess 171 of the base material 1. The method to attach the first cover 7 to the base material 1 is not specifically limited. For example, an adhesive such as a UV-curable resin may be employed. In the illustrated example, the first cover 7 has a flat plate shape, with a constant size in the x-direction.

The second cover 8 covers the opening 17. The material of the second cover 8 is not specifically limited. In this embodiment, the second cover 8 is formed of glass. A predetermined coating may be applied to the second cover 8, to attenuate predetermined external light. In the illustrated example, the second cover 8 is rectangular as viewed in the z-direction, and accommodated in the annular recess 440 of the base material 1. The method to attach the second cover 8 to the base material 1 is not specifically limited. For example, an adhesive such as a UV-curable resin may be employed. In the illustrated example, the second cover 8 has a flat plate shape, with a constant size in the z-direction.

When the first cover 7 and the second cover 8 are provided, the first cover 7 and the second cover 8 may be attached so as to tightly close the inner space defined by the base material 1. In this case, it is preferable to attach the first cover 7 and the second cover 8 to the base material 1 in a depressurized environment, so that the first cover 7 and the second cover 8 are pressed against the base material 1 by the atmospheric pressure, when the semiconductor laser device A1 is completed.

The semiconductor laser device A1 provides the following advantageous effects.

According to this embodiment, the plurality of mounting terminal sections 531 and the mounting terminal section 532 are formed on the obverse face 11 (third obverse face 41), so that the obverse face 11 (third obverse face 41) serves as a mounting face. Therefore, the semiconductor laser device A1 can be surface-mounted on a non-illustrated circuit board.

When the obverse face 11 can be used as a mounting face, the laser light can be emitted from the semiconductor laser device A1 to one side (front side) in the x-direction. Accordingly, the emission direction of the laser light can be shifted by 90 degrees, with respect to a semiconductor laser device to be mounted using leads.

The opening 17 provides an opening from the obverse face 11 serving as the mounting face. In the manufacturing process of the semiconductor laser device A1, the base material 1 can be set, after being formed, such that the opening 17 is oriented vertically upward. Then the semiconductor laser element 6 is mounted, the wires 67 are bonded, and the first cover 7 and the second cover 8 are attached, with the orientation of the base material 1 kept as above. In addition, a continuity test and a light emission test of the semiconductor laser element 6 can be carried out, using the plurality of mounting terminal sections 531 and the mounting terminal section 532, which are oriented vertically upward. Therefore, it is no longer necessary to turn the semiconductor laser device A1 upside down, to perform the test using the plurality of mounting terminal sections 531 and the mounting terminal section 532, after the completion of the semiconductor laser device A1. In addition, since the base material 1 includes a hollow portion at the emission part 18, a stress originating from the operation of the semiconductor laser device A1 can be mitigated.

Because of the presence of the pedestal portion 240 and the bottom portion 250, the first obverse face 21 on one side of the pedestal portion 240 in the x-direction is located on one side in the z-direction, with respect to the bottom portion 250. Utilizing such first obverse face 21 as the mounting face prevents the laser light emitted from the semiconductor laser element 6 from being blocked by the pedestal portion 240 and the bottom portion 250. In addition, forming the end portion of the semiconductor laser element 6 on one side (front end) in the x-direction, so as to stick out from the pedestal portion 240 to one side (front side) in the x-direction, is advantageous in preventing the laser light from being blocked. However, it is not mandatory that the semiconductor laser element 6 is formed so as to stick out from the pedestal portion 240.

The plurality of second strip sections 522 extend to the other side (rear side) in the x-direction, with respect to the semiconductor laser element 6. In other words, the plurality of second strip sections 522 are provided on the opposite side from the side to which the laser light of the semiconductor laser element 6 is emitted. Such a configuration allows the plurality of second strip sections 522 to be linearly formed, thereby minimizing the difference in distance between each other. This configuration facilitates the lengths of the conduction paths to the plurality of waveguides 62 and the plurality of electrodes 63 of the semiconductor laser element 6 to be uniform. Further, the first strip section 512 is also linear like the plurality of second strip sections 522, and spaced from the plurality of second strip sections 522 in the y-direction, as viewed in the z-direction. Therefore, an accidental mutual interference can be prevented, when power is supplied. This is advantageous in causing the plurality of semiconductor laser elements 6 to individually emit the light, at a desired timing.

The base material 1 includes the inner end face 36. From the semiconductor laser element 6, the light may be emitted to the other side (rear side) in the x-direction, not only to one side (front side) in the x-direction. It is preferable that the light emitted backward is not superposed on the light emitted forward. In this embodiment, the inner end face 36 is provided on the other side (rear side) of the semiconductor laser element 6 in the x-direction. Such a configuration prevents the laser light proceeding from the semiconductor laser element 6 to the rear side from being directed to the emission part 18.

On the obverse face 11 or mounting face, the locations of the plurality of mounting terminal sections 531 and the mounting terminal section 532 are biased to the other side (rear side) in the x-direction. In contrast, the plurality of front portions 505 are spaced from the plurality of mounting terminal sections 531 and the mounting terminal section 532, and located on one side (front side) in the x-direction. Therefore, the surface tension of molten solder can be applied to the semiconductor laser device A1 with a better balance, when the semiconductor laser device A1 is mounted on a circuit board. Consequently, the mounting position and posture of the semiconductor laser device A1 can be more properly adjusted.

FIG. 11 to FIG. 40 illustrate the variations and other embodiments of the present disclosure. In these drawings, the elements same as or similar to those of the foregoing embodiment are given the same numeral. As a matter of course, a part of the foregoing embodiment and a part of the following variations and embodiments may be combined or replaced with each other, to attain various combinations.

Figure 11:
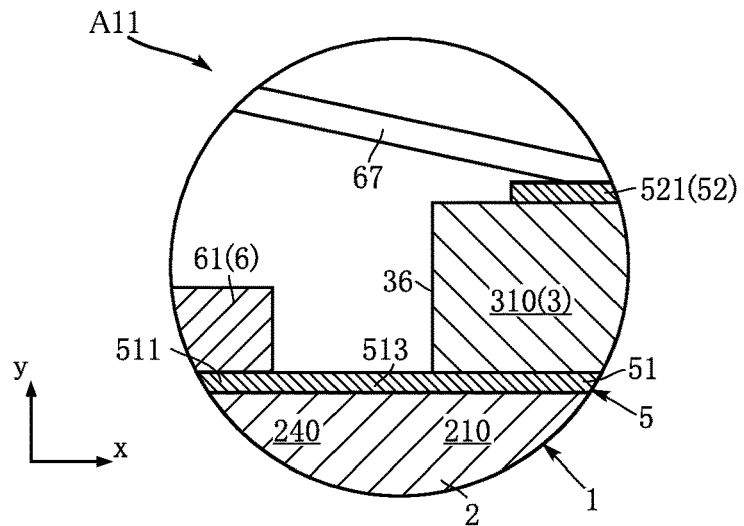
FIG. 11 is an enlarged cross-sectional view for explaining a first variation of the semiconductor laser device according to the first embodiment.

FIG. 11 is an enlarged partial cross-sectional view showing a first variation of the semiconductor laser device A1. In the semiconductor laser device A11 according to this variation, the inner end face 36 is upright along the z-direction, and not inclined with respect thereto.

Figure 12:
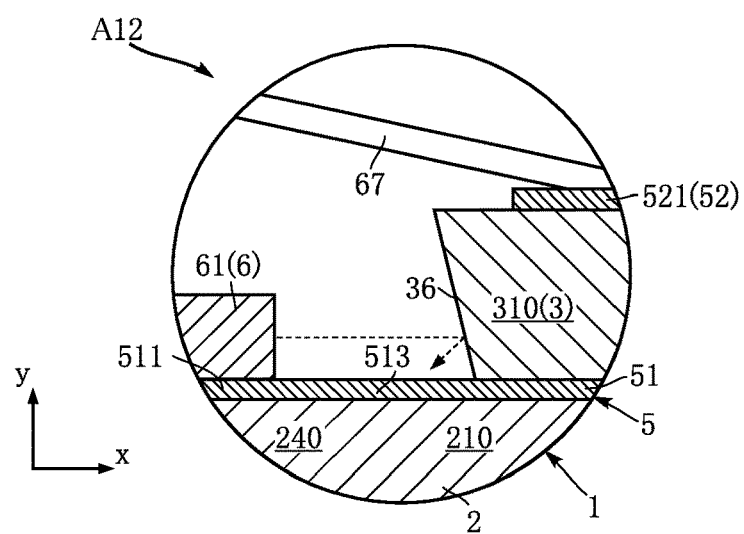
FIG. 12 is an enlarged cross-sectional view for explaining a second variation of the semiconductor laser device according to the first embodiment.

FIG. 12 is an enlarged partial cross-sectional view showing a second variation of the semiconductor laser device A1. In the semiconductor laser device A12 according to this variation, the inclination of the inner end face 36 is different from that of the inner end face 36 in the semiconductor laser device A1. In this variation, the inner end face 36 is inclined so as to be shifted to the other side (rear side) in the x-direction, along the direction from one side (upper side) in the z-direction toward the other side (lower side) in the z-direction.

As is apparent from the foregoing variations, the angle of the inner end face 36 may be determined as desired.

Figure 13:
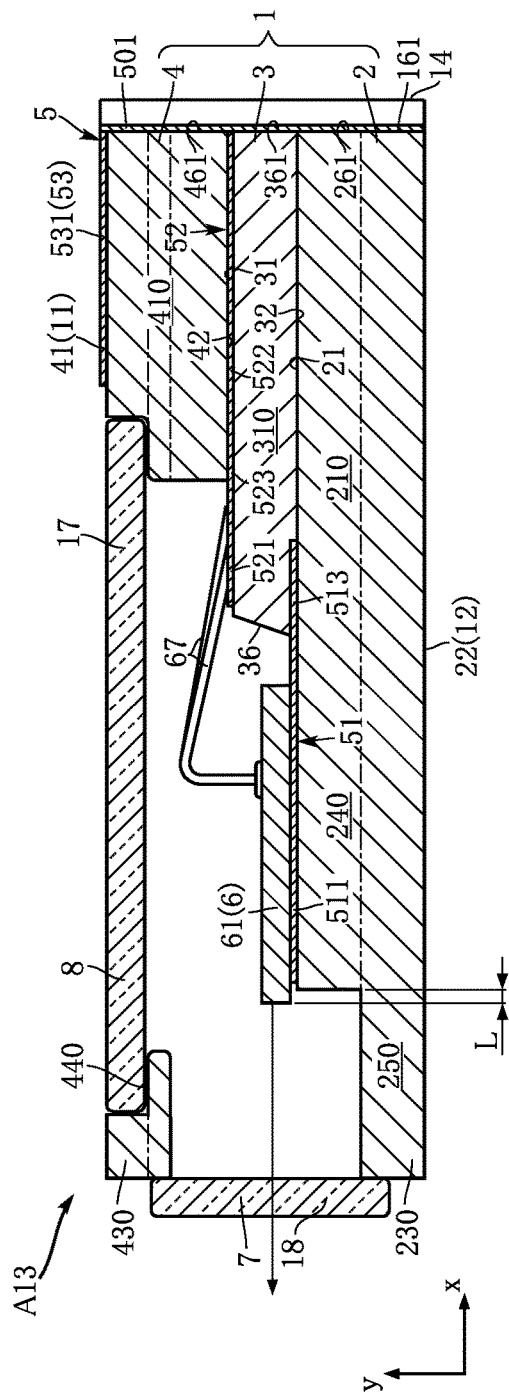
FIG. 13 is a cross-sectional view for explaining a third variation of the semiconductor laser device according to the first embodiment.

FIG. 13 is a cross-sectional view showing a third variation of the semiconductor laser device A1. In the semiconductor laser device A13 according to this variation, the method to attach the first cover 7 to the base material 1 is different from the method adopted in the semiconductor laser device A1.

In this variation, the base material 1 is without the front recess 171. The first cover 7 is attached to the front end face 13 of the base material 1, for example via an adhesive. As is apparent from this variation, the method or structure to attach the first cover 7 to the base material 1 is not specifically limited.

Figure 14:
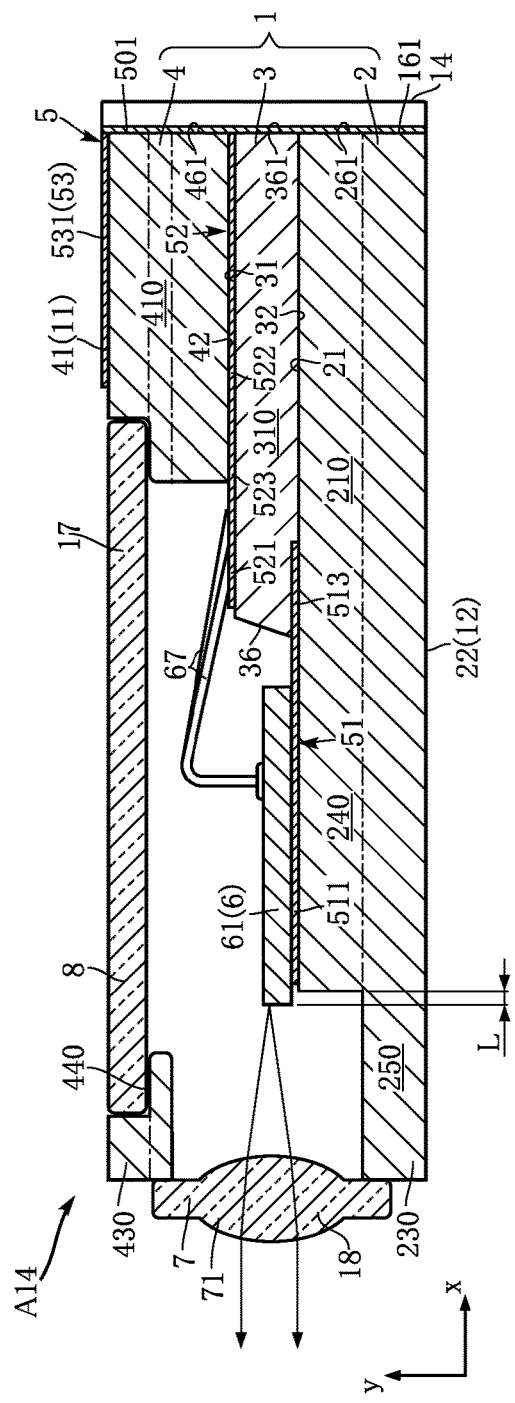
FIG. 14 is a cross-sectional view for explaining a fourth variation of the semiconductor laser device according to the first embodiment.

FIG. 14 is a cross-sectional view showing a fourth variation of the semiconductor laser device A1. In the semiconductor laser device A14 according to this variation, the first cover 7 has a different configuration from that of the semiconductor laser device A1.

In this variation, the first cover 7 includes a lens portion 71. The lens portion 71 swells in the x-direction, thus forming what is known as a convex lens. The first cover 7 thus configured refracts the laser light from the semiconductor laser element 6 with the lens portion 71, thereby improving the directionality in the x-direction. Here, the lens portion 71 formed as the convex lens is merely exemplary, and the lens portion 71 may be formed in various other shape, such as a concave lens.

Figure 15:
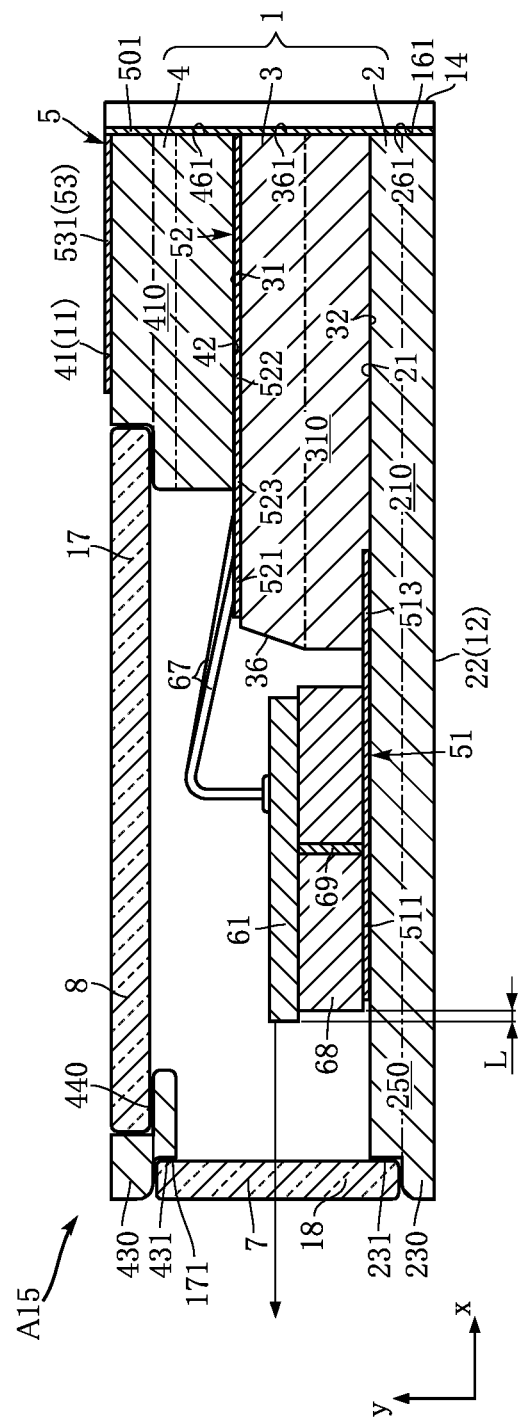
FIG. 15 is a cross-sectional view for explaining a fifth variation of the semiconductor laser device according to the first embodiment.

FIG. 15 is a cross-sectional view showing a fifth variation of the semiconductor laser device A1. In the semiconductor laser device A15 according to this variation, the configuration of the semiconductor laser element 6 is different from that of the semiconductor laser device A1.

In this variation, the semiconductor laser element 6 includes a submount 68. The submount 68 is, for example, formed of Si, GaN, SiC, or AlN. The submount 68 includes a semiconductor layer 61 formed on the upper face thereof.

The submount 68 includes a through wiring 69. The through wiring 69 is a conductive material penetrating through the submount 68 in the z-direction. The through wiring 69 is electrically continuous with a non-illustrated electrode of the semiconductor layer 61.

The first layer 2 according to this variation is without the pedestal portion 240 provided in the semiconductor laser device A1. The first main portion 210 and the bottom portion 250 have the same thickness as each other. The element mounting section 511 of the first wiring portion 51 of the wiring portion 5 is formed on the first obverse face 21 of the bottom portion 250. The through wiring 69 of the submount 68 is electrically continuous with the element mounting section 511.

The configuration according to this variation also enables the semiconductor laser device A15 to be surface-mounted. The semiconductor laser element 6 may be with or without the submount 68. Various types of the semiconductor laser element 6 can be adopted, by modifying the configuration of the base material 1 and the wiring portion 5, as the case may be.

Figure 16:
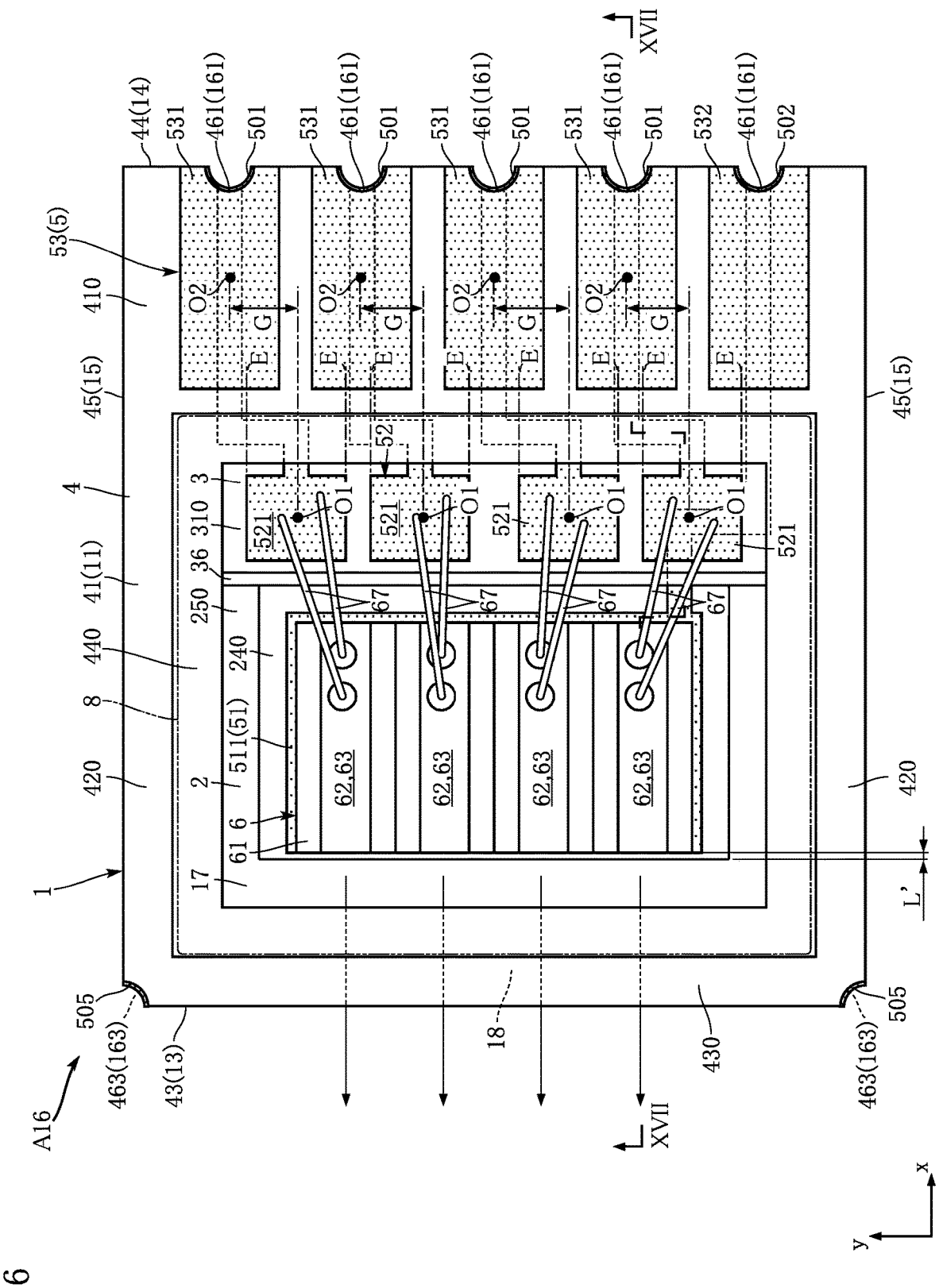
FIG. 16 is a plan view showing a sixth variation of the semiconductor laser device according to the first embodiment.
Figure 17:
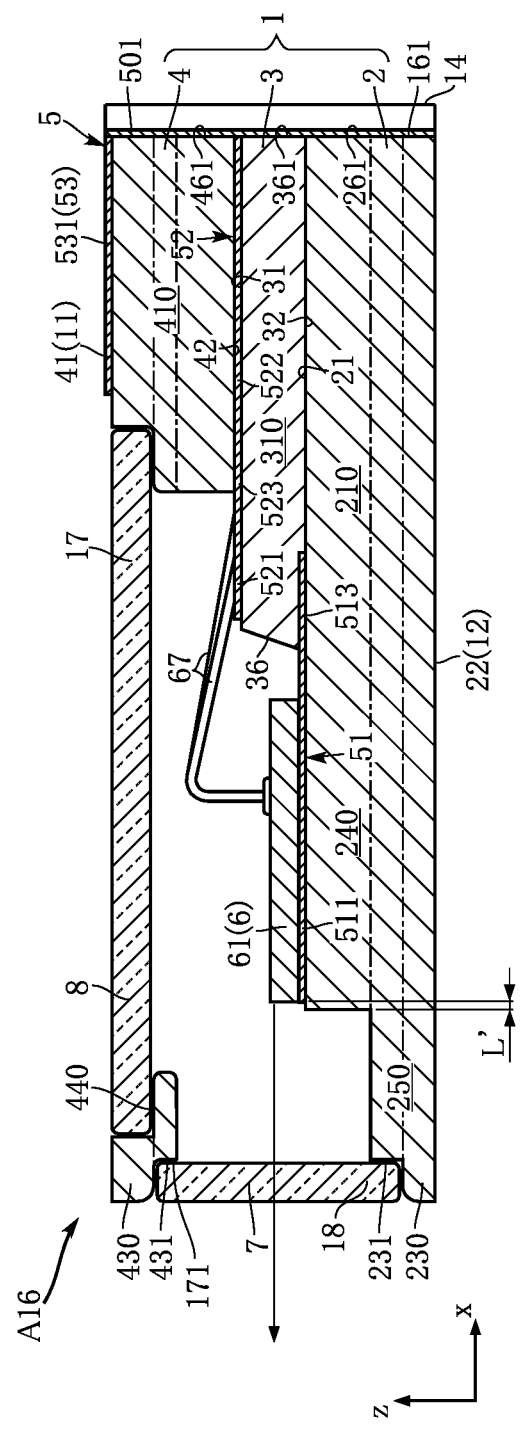
FIG. 17 is a cross-sectional view taken along a line XVII-XVII in FIG. 16.

FIG. 16 is a plan view showing a sixth variation of the semiconductor laser device A1. FIG. 17 is a cross-sectional view taken along a line XVII-XVII in FIG. 16.

In the semiconductor laser device A16 according to this variation, the end portion of the semiconductor laser element 6 on one side in the x-direction is shifted to the other side in the x-direction by a length L', with respect to the end portion of the pedestal portion 240 on one side in the x-direction. In other words, the semiconductor laser element 6 is retracted to the other side in the x-direction from the end portion of the pedestal portion 240 on one side in the x-direction, instead of sticking out to one side in the x-direction from the end portion of the pedestal portion 240 on one side in the x-direction.

The configuration according to variation increases the area where the semiconductor laser element 6 and the element mounting section 511 (pedestal portion 240) overlap with each other. Therefore, the heat originating from the light emission of the semiconductor laser element 6 can be efficiently conducted to the pedestal portion 240 (base material 1). In addition, the increase in bonding area between the semiconductor laser element 6 and the element mounting section 511 (pedestal portion 240) leads to increased bonding strength therebetween. Further, as is apparent from this variation, the positional relation between the end portion of the semiconductor laser element 6 on one side in the x-direction and the end portion of the pedestal portion 240 on one side in the x-direction (or end portion of the submount 68 on one side in the x-direction) is in no way limited. This also applies to other variations and embodiments.

Figure 18:
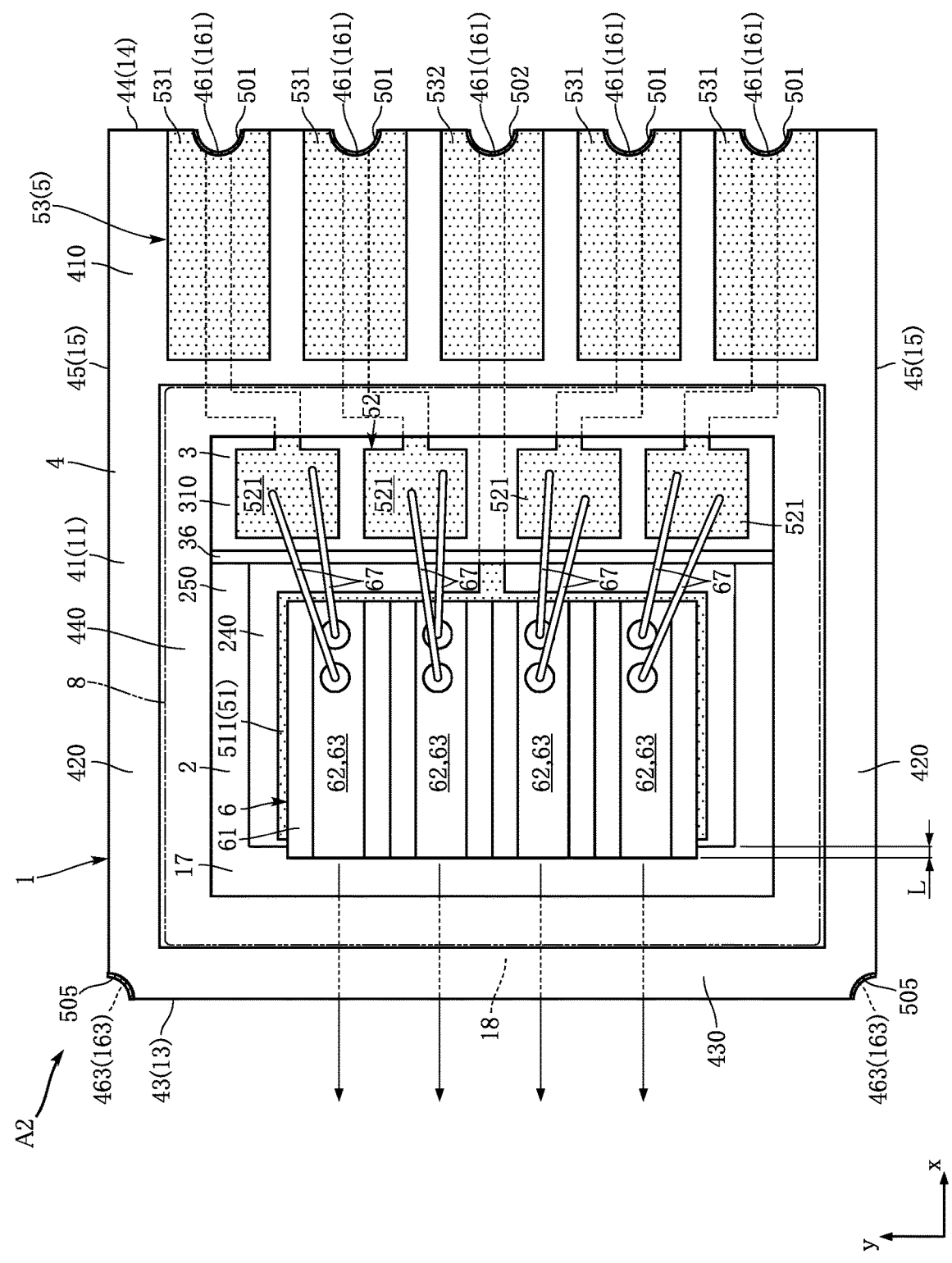
FIG. 18 is a plan view showing a semiconductor laser device according to a second embodiment.
Figure 19:
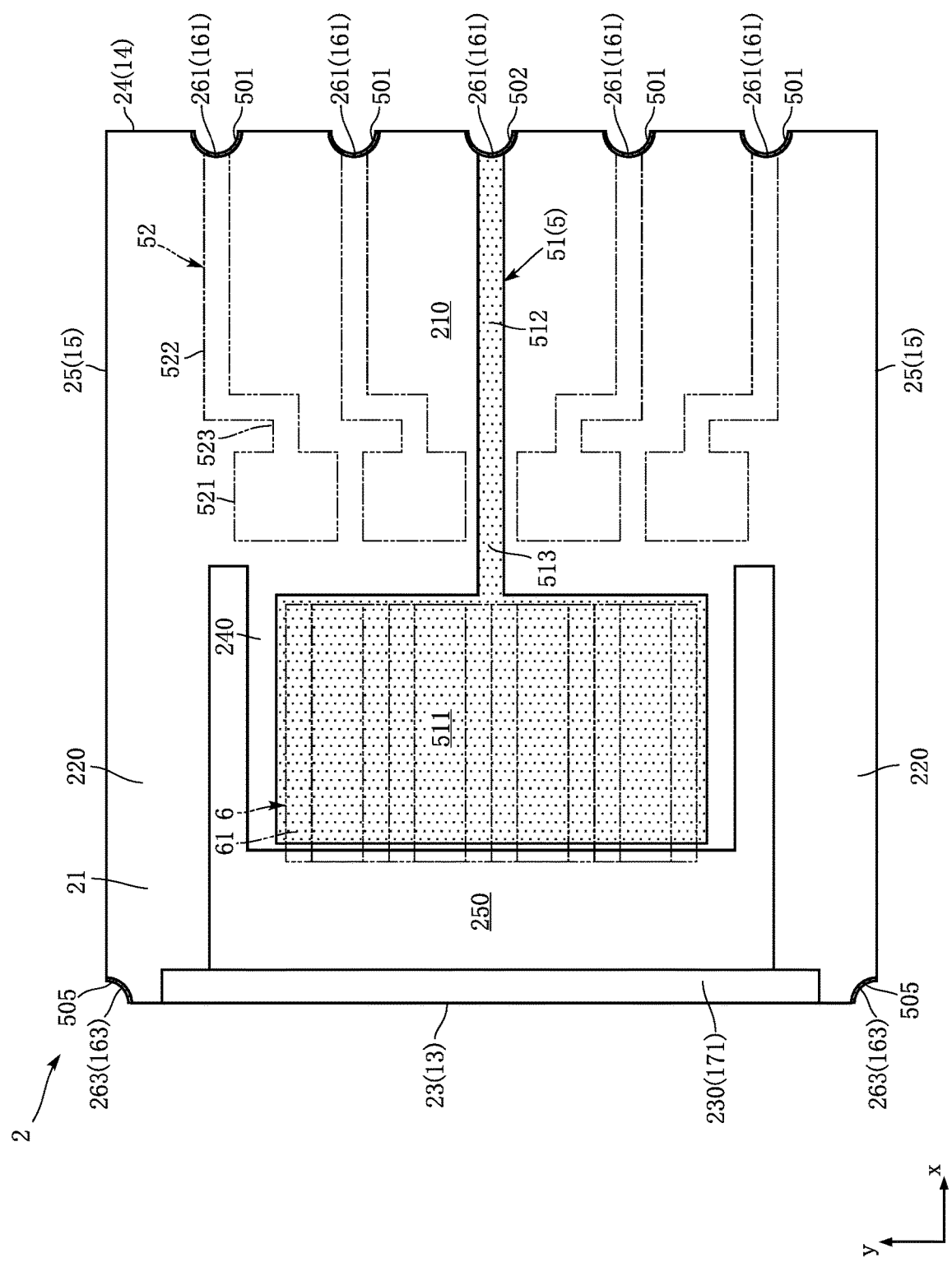
FIG. 19 is a plan view for explaining a base material of the semiconductor laser device according to the second embodiment.
Figure 20:
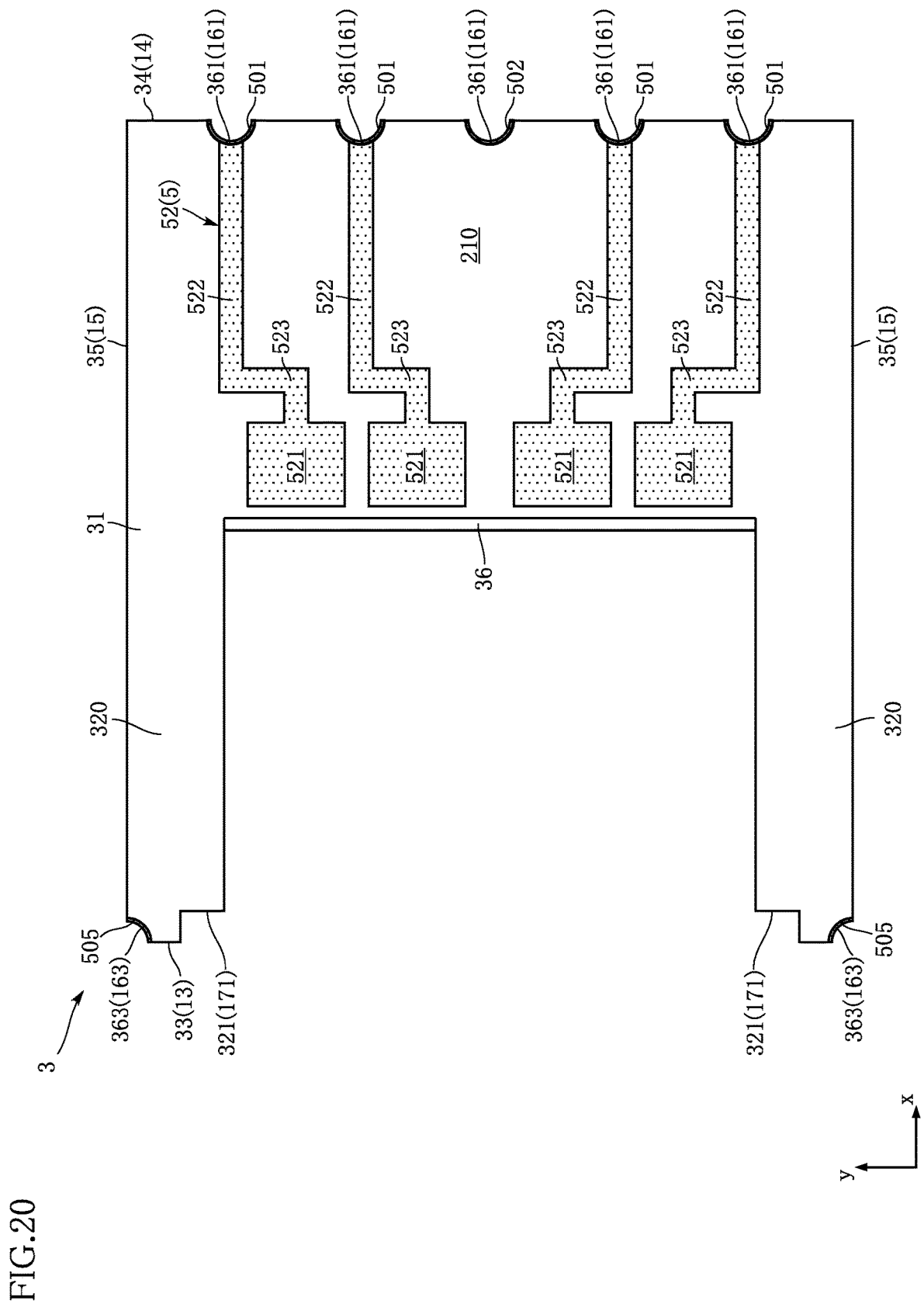
FIG. 20 is a plan view for explaining the base material of the semiconductor laser device according to the second embodiment.

FIG. 18 to FIG. 20 each illustrate a semiconductor laser device according to a second embodiment of the present disclosure. FIG. 18 is a plan view showing a semiconductor laser device A2 according to this embodiment. FIG. 19 is a partial plan view showing the base material 1 of the semiconductor laser device A2. FIG. 20 is another plan view showing the base material 1 of the semiconductor laser device A2.

The semiconductor laser device A2 is different from the semiconductor laser device A1, in the location of the first strip section 512 of the first wiring portion 51 and the plurality of second strip sections 522 of the second wiring portion 52.

In this embodiment, the plurality of second strip sections 522 are located on the respective sides of the first strip section 512 in the y-direction, as viewed in the z-direction. In the illustrated example, two each of the second strip sections 522 are located on the respective sides of the first strip section 512 in the y-direction.

As shown in FIG. 19, the first strip section 512 is located generally at the center of the first main portion 210 in the y-direction. The first connecting section 513 has a linear shape extending in the x-direction, instead of a bent shape.

As shown in FIG. 20, the four second connecting sections 523 include two second connecting sections 523 on one side in the y-direction, and two second connecting sections 523 on the other side in the y-direction, which are bent in opposite directions to each other.

The configuration according to this embodiment also enables the semiconductor laser device A2 to be surface-mounted. In addition, the configuration according to this embodiment facilitates the path lengths of the plurality of second strip sections 522 to be made uniform. Further, since the first strip section 512 and the first connecting section 513 both have the linear shape, the inductance component of the conduction path can be reduced.

Figure 21:
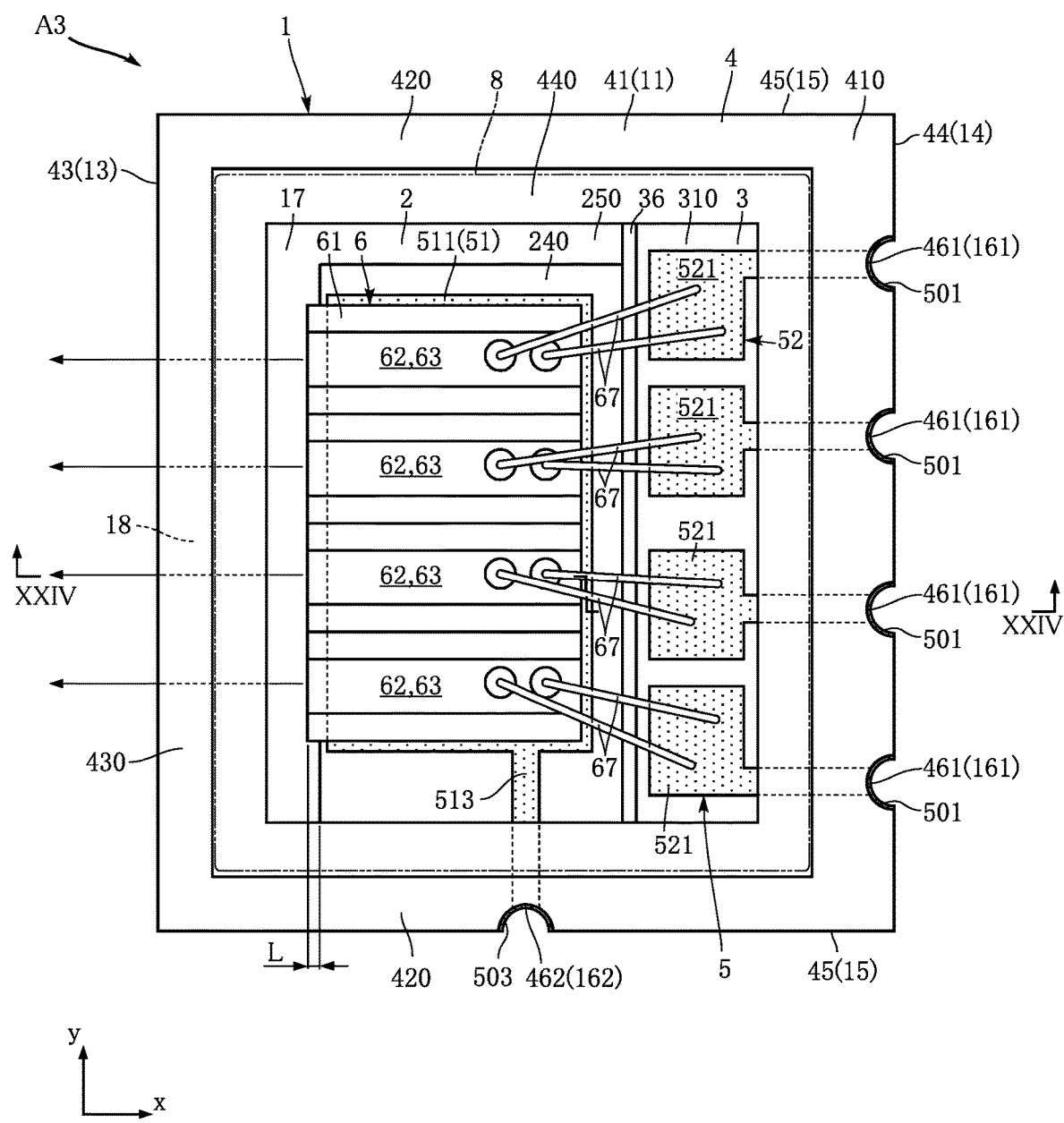
FIG. 21 is a plan view showing a semiconductor laser device according to a third embodiment.
Figure 22:
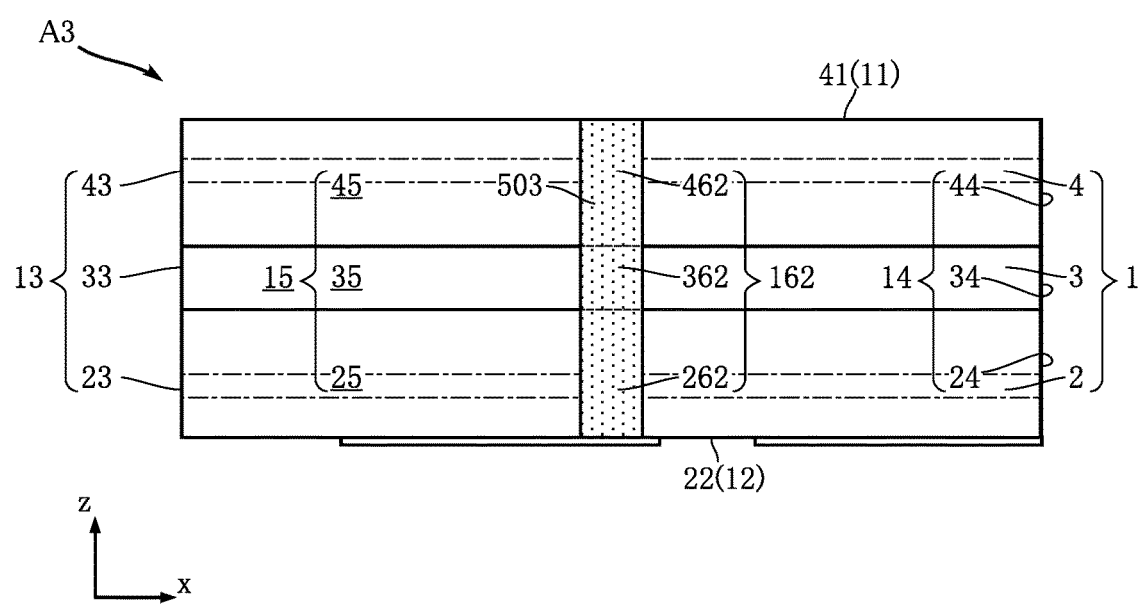
FIG. 22 is a side view showing the semiconductor laser device according to the third embodiment.
Figure 23:
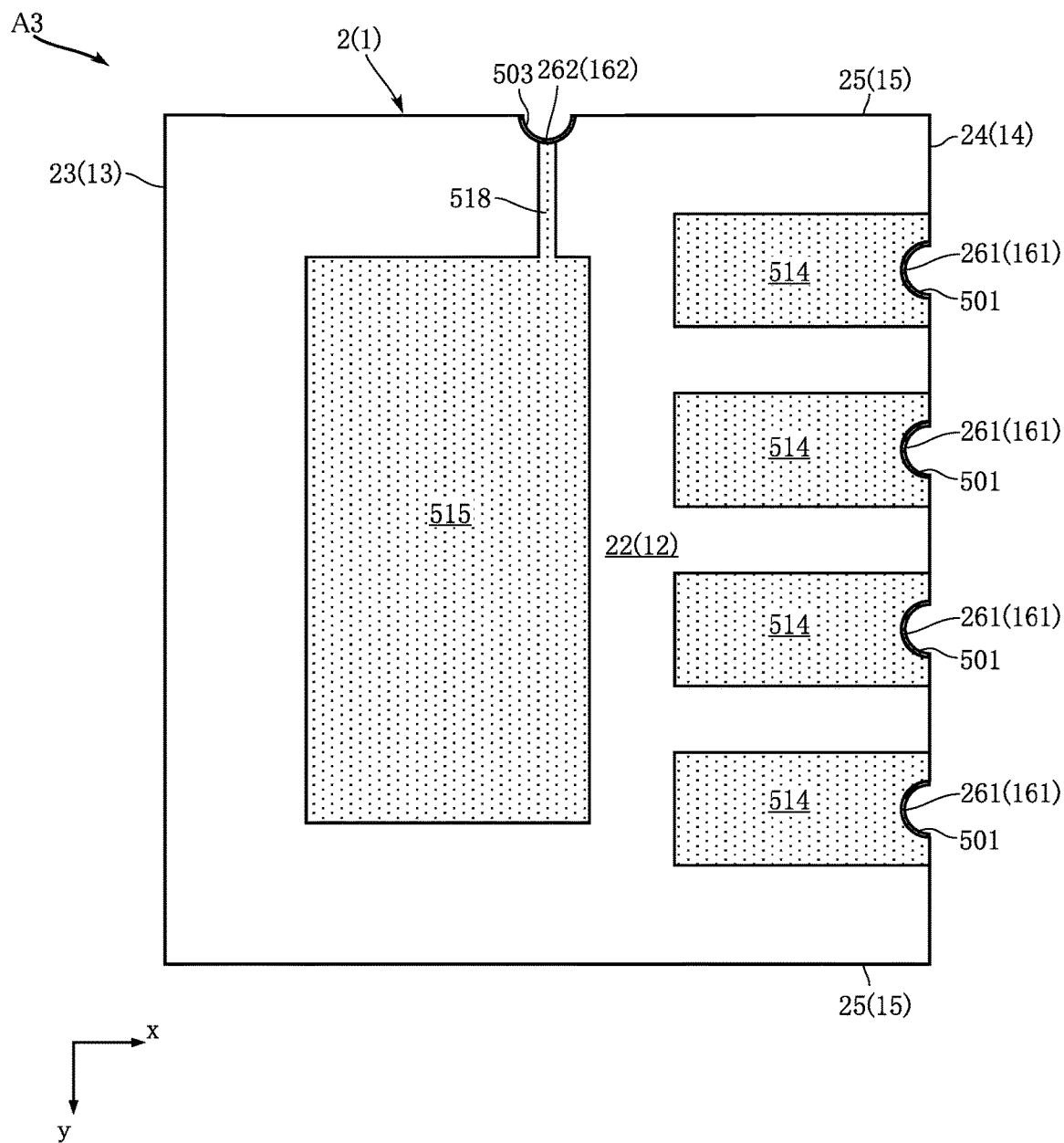
FIG. 23 is a bottom view showing the semiconductor laser device according to the third embodiment.
Figure 24:
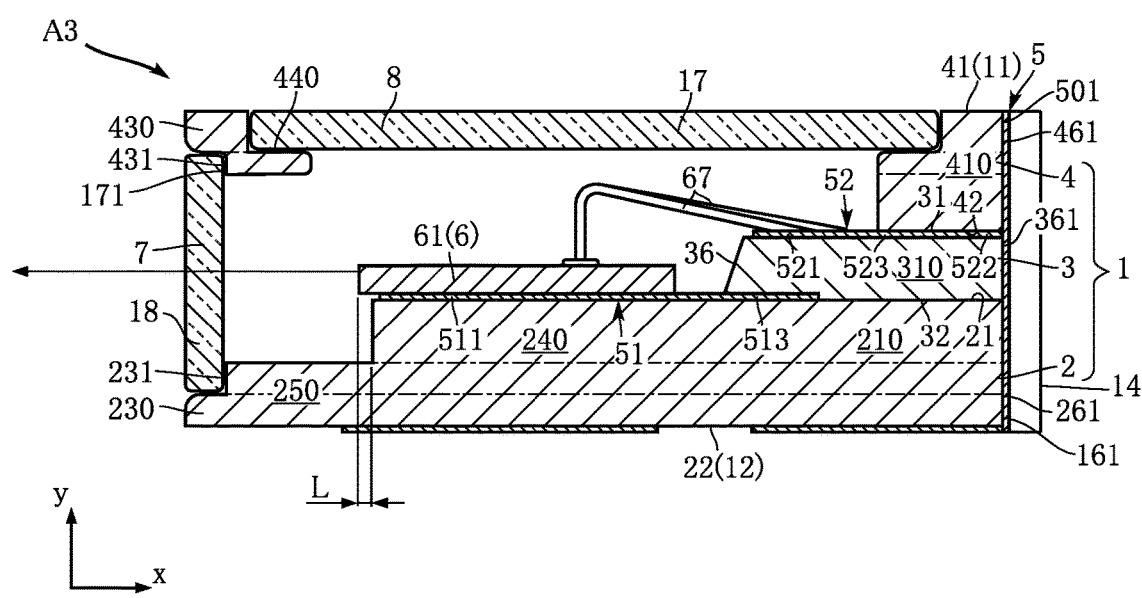
FIG. 24 is a cross-sectional view taken along a line XXIV-XXIV in FIG. 21.
Figure 25:
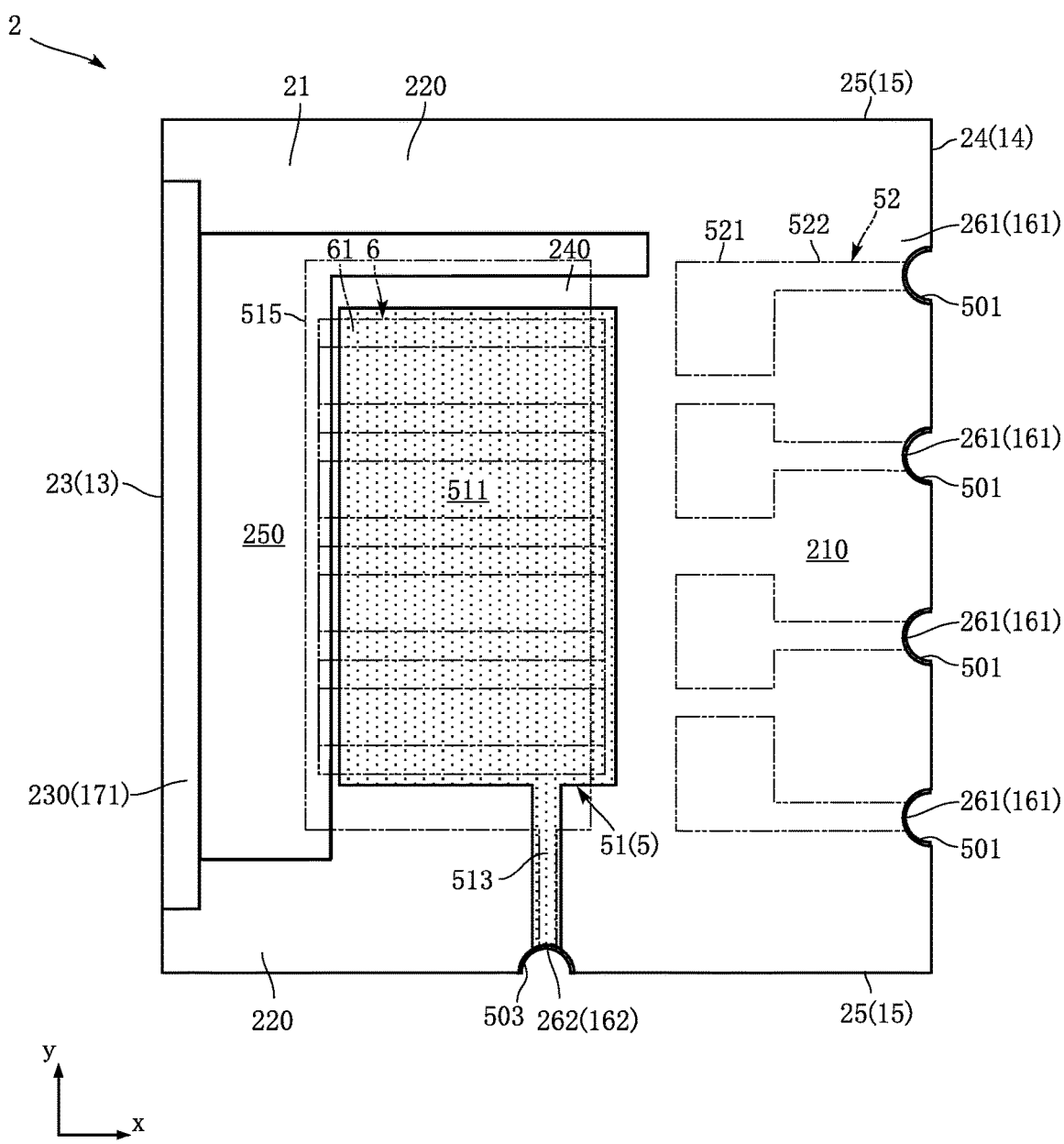
FIG. 25 is a plan view for explaining a base material of the semiconductor laser device according to the third embodiment.
Figure 26:
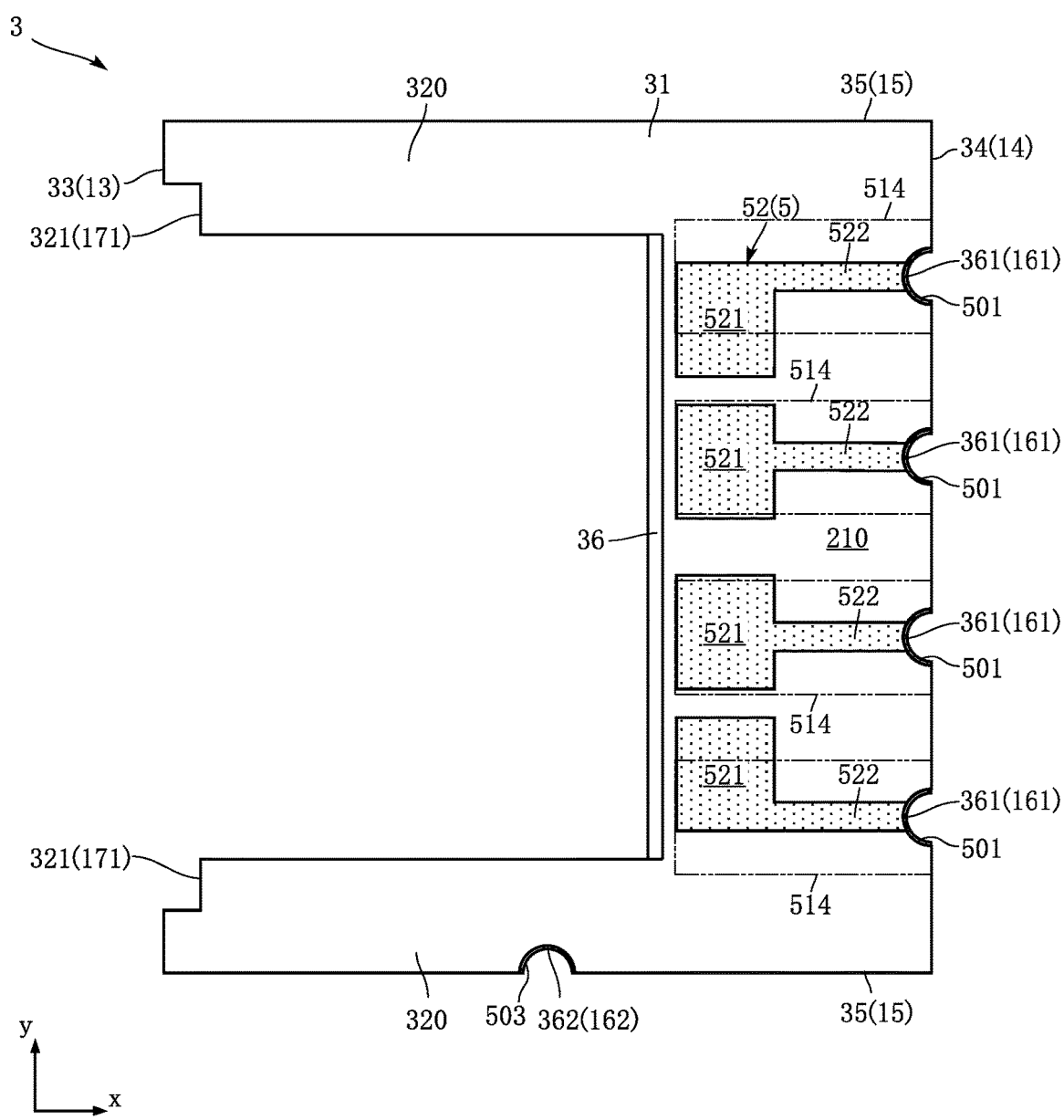
FIG. 26 is a plan view for explaining the base material of the semiconductor laser device according to the third embodiment.
Figure 27:
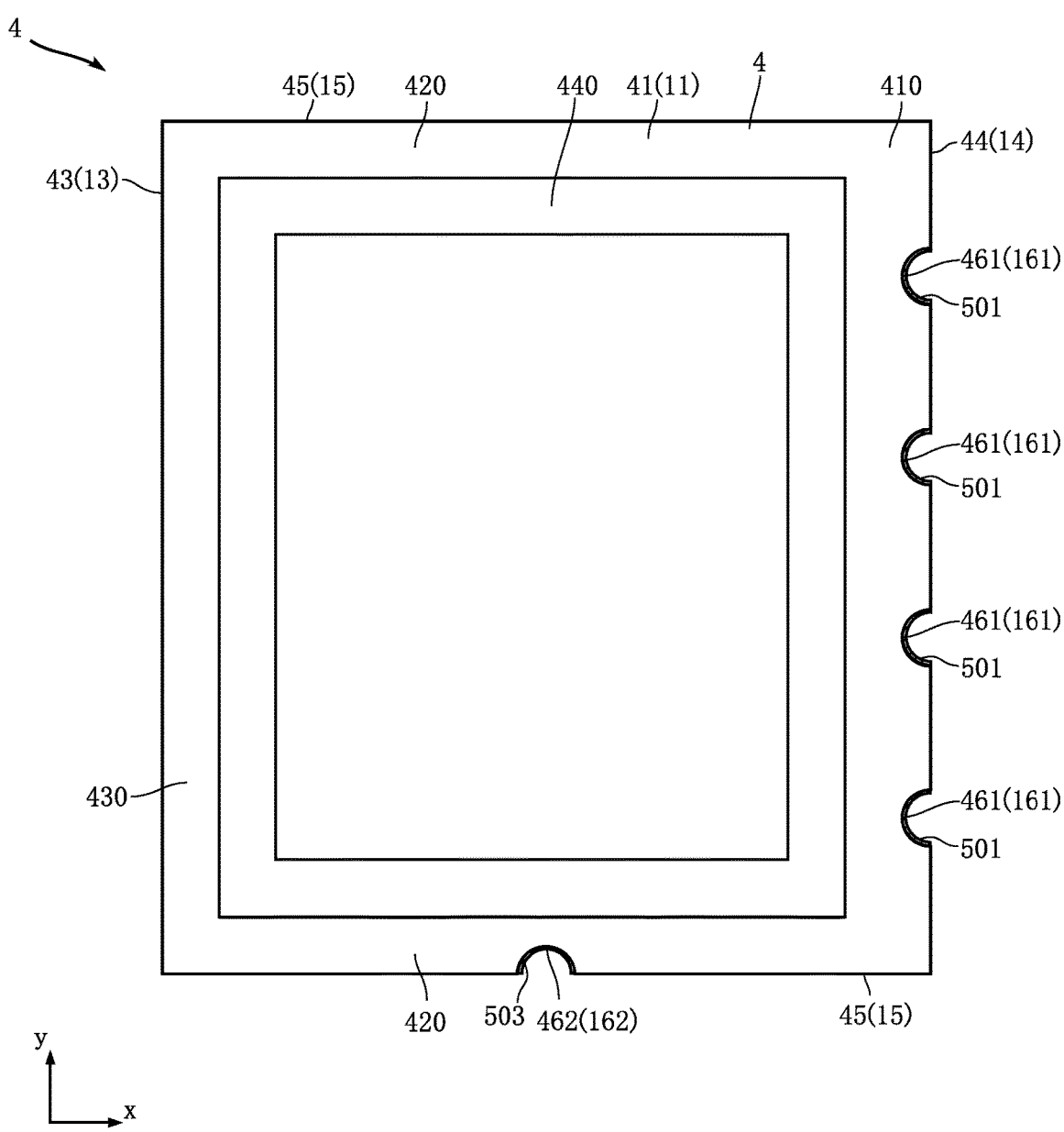
FIG. 27 is a plan view for explaining the base material of the semiconductor laser device according to the third embodiment.

FIG. 21 to FIG. 27 each illustrate a semiconductor laser device according to a third embodiment of the present disclosure. FIG. 21 is a plan view showing a semiconductor laser device A3 according to this embodiment. FIG. 22 is a side view showing the semiconductor laser device A3. FIG. 23 is a bottom view showing the semiconductor laser device A3. FIG. 24 is a cross-sectional view taken along a line XXIV-XXIV in FIG. 21. FIG. 25 is a partial plan view showing the base material 1 of the semiconductor laser device A3. FIG. 26 is another partial plan view showing the base material 1 of the semiconductor laser device A3. FIG. 27 is another partial plan view showing the base material 1 of the semiconductor laser device A3.

In the semiconductor laser device A3, as shown in FIG. 23 and FIG. 24, the reverse face 12 of the base material 1 is used as a mounting face.

The base material 1 includes a side groove 162. The side groove 162 is recessed from one of the side faces 15, and extends along the z-direction. In this embodiment, the side groove 162 reaches the first reverse face 22 (reverse face 12). In the illustrated example, the side groove 162 also reaches the third obverse face 41 (obverse face 11).

The first layer 2 includes a first side groove 262. The first side groove 262 is recessed from the first side face 25, and extends along the z-direction. The second layer 3 includes a second side groove 362. The second side groove 362 is recessed from the second side face 35, and extends along the z-direction. The third layer 4 includes a third side groove 462. The third side groove 462 is recessed from the third side face 45, and extends along the z-direction. The side groove 162 includes the first side groove 262, the second side groove 362, and the third side groove 462.

The wiring portion 5 includes the plurality of rear communicating portions 501 and a side communicating portion 503. The plurality of rear communicating portions 501 respectively cover the plurality of rear grooves 161, as in the foregoing embodiments. The side communicating portion 503 covers the side groove 162, and reaches the end portion of the side groove 162 on the other side (lower end) in the z-direction. In the illustrated example, the side communicating portion 503 also reaches the end portion of the side groove 162 on one side (upper end) in the z-direction.

As shown in FIG. 23 and FIG. 25, the first wiring portion 51 includes the element mounting section 511, the first connecting section 513, a plurality of mounting terminal sections 514, a mounting terminal section 515, and a first connecting section 518. The first connecting section 513 extends from the element mounting section 511 toward the first side groove 262 in the y-direction, and reaches the first side groove 262. Accordingly, the first connecting section 513 is in contact with the side communicating portion 503.

The mounting terminal section 515 is formed on the first reverse face 22 (reverse face 12). The mounting terminal section 515 is rectangular as viewed in the z-direction, and larger than the mounting terminal section 514. The first connecting section 518 extends from the mounting terminal section 515 in the y-direction, and reaches the first side groove 262. Accordingly, the first connecting section 518 is in contact with the side communicating portion 503. Consequently, the element mounting section 511 is electrically continuous with the mounting terminal section 515, via the first connecting section 513, the side communicating portion 503 and the first connecting section 518. Here, it is preferable to form the mounting terminal section 515 so as to overlap with the semiconductor laser element 6, as viewed in the z-direction, as shown in FIG. 24 and FIG. 25. The mounting terminal section 515 is, for example, a cathode electrode.

The plurality of mounting terminal sections 514 are provided in a region of the first reverse face 22 (reverse face 12) on the other side (rear side) in the x-direction. The plurality of mounting terminal sections 514 respectively reach the plurality of first rear grooves 261. Accordingly, the plurality of mounting terminal sections 514 are respectively in contact with the plurality of rear communicating portions 501. Here, it is preferable to form the plurality of mounting terminal sections 514 so as to respectively overlap with the plurality of wire bonding sections 521, as viewed in the z-direction, as shown in FIG. 24 and FIG. 26. The mounting terminal section 514 is, for example, an anode electrode.

In the illustrated example, the second wiring portion 52 includes the plurality of wire bonding sections 521 and the plurality of second strip sections 522, but is without the second connecting section 523 provided in the foregoing embodiments. In addition, the wiring portion 5 is without the third wiring portion provided in the foregoing embodiments. The second strip section 522 is in contact with the rear communicating portion 501. Therefore, the plurality of wire bonding sections 521 are respectively electrically continuous with the plurality of mounting terminal sections 514, via the plurality of second strip sections 522 and the plurality of rear communicating portions 501. However, the second wiring portion 52 may include the second connecting section 523, and the wiring portion 5 may include the third wiring portion 53.

The configuration according to this embodiment also enables the semiconductor laser device A3 to be surface-mounted, using the reverse face 12 as a mounting face. In addition, this embodiment eliminates the need to form the wiring portion 5 on the obverse face 11 of the base material 1. In addition, the mounting terminal section 515 can be located so as to overlap with the semiconductor laser element 6, as viewed in the z-direction. Further, the plurality of mounting terminal sections 514 can be located so as to respectively overlap with the plurality of wire bonding sections 521, as viewed in the z-direction. This is advantageous in reducing the size of the semiconductor laser device A3.

Figure 28:
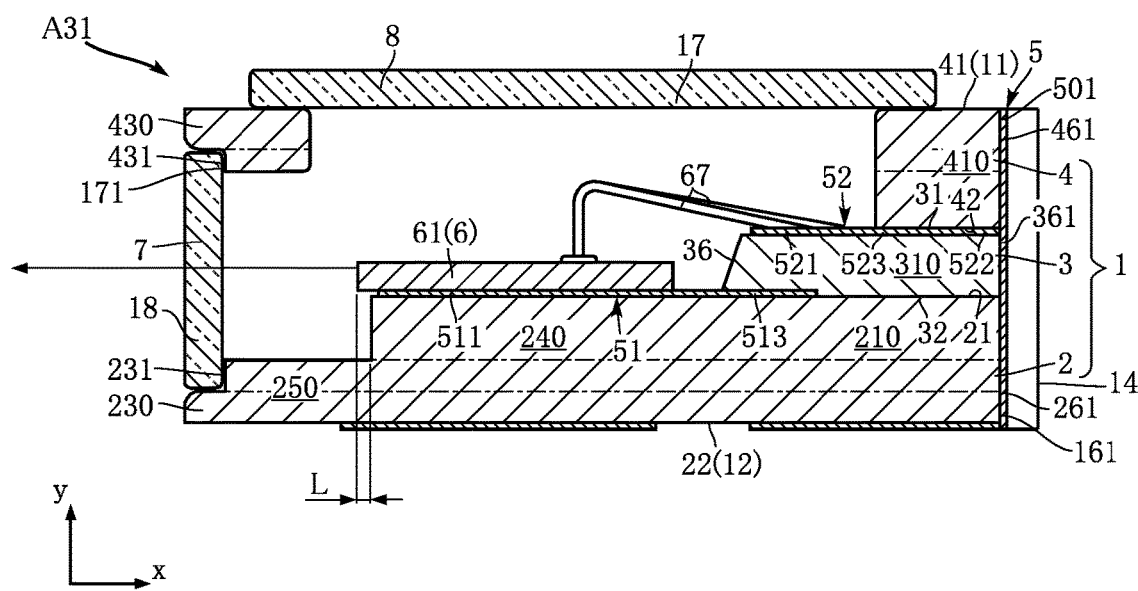
FIG. 28 is a cross-sectional view showing a first variation of the semiconductor laser device according to the third embodiment.

FIG. 28 is a cross-sectional view showing a first variation of the semiconductor laser device A3. In the semiconductor laser device A31 according to this variation, the method to attach the second cover 8 to the base material 1 is different from the foregoing examples.

In this variation, the base material 1 is without the annular recess 440. The second cover 8 is attached to the obverse face 11 of the base material 1, for example via an adhesive. As is apparent from this variation, the method or structure to attach the second cover 8 to the base material 1 is not specifically limited.

Figure 29:
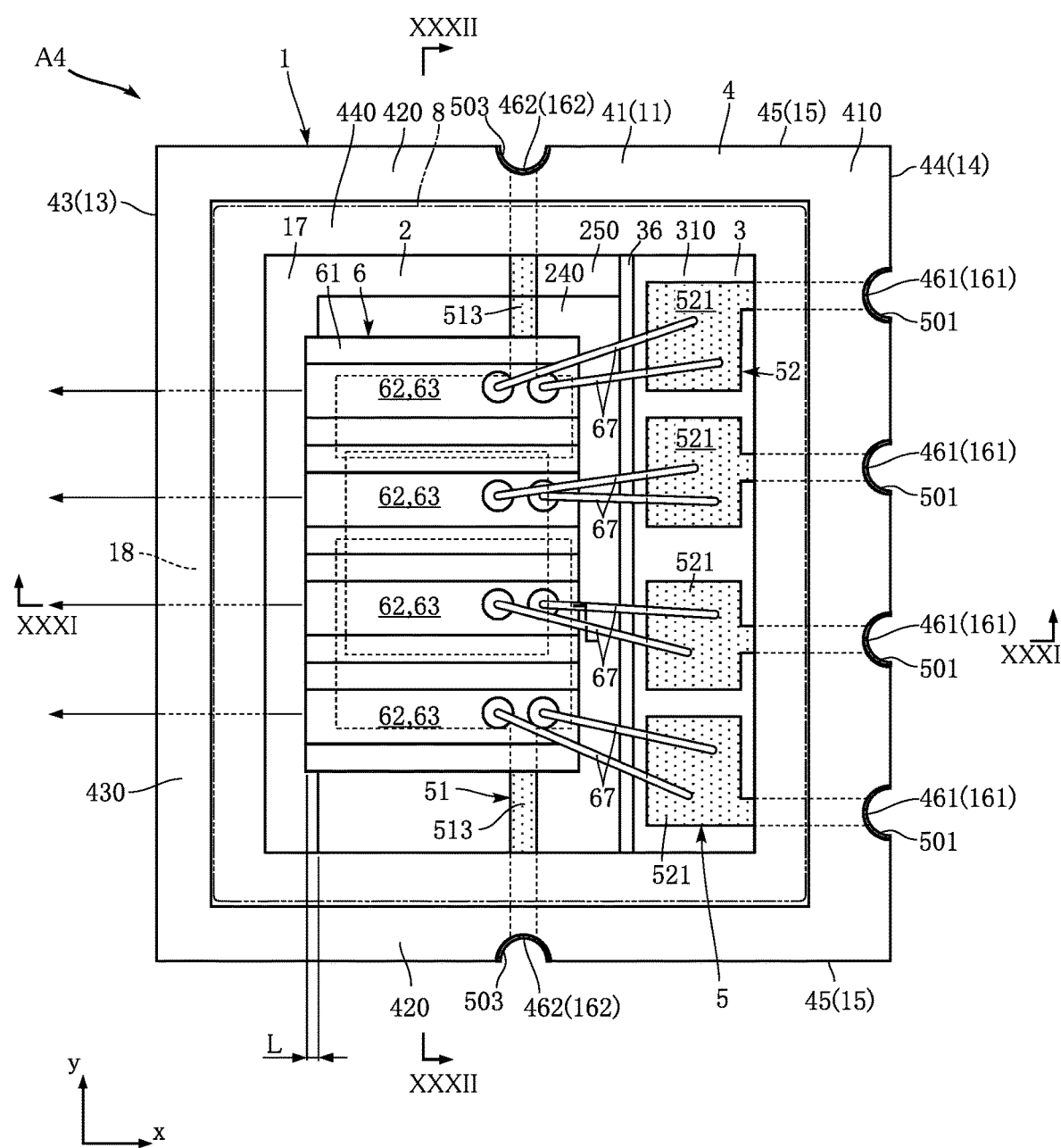
FIG. 29 is a plan view showing a semiconductor laser device according to a fourth embodiment.
Figure 30:
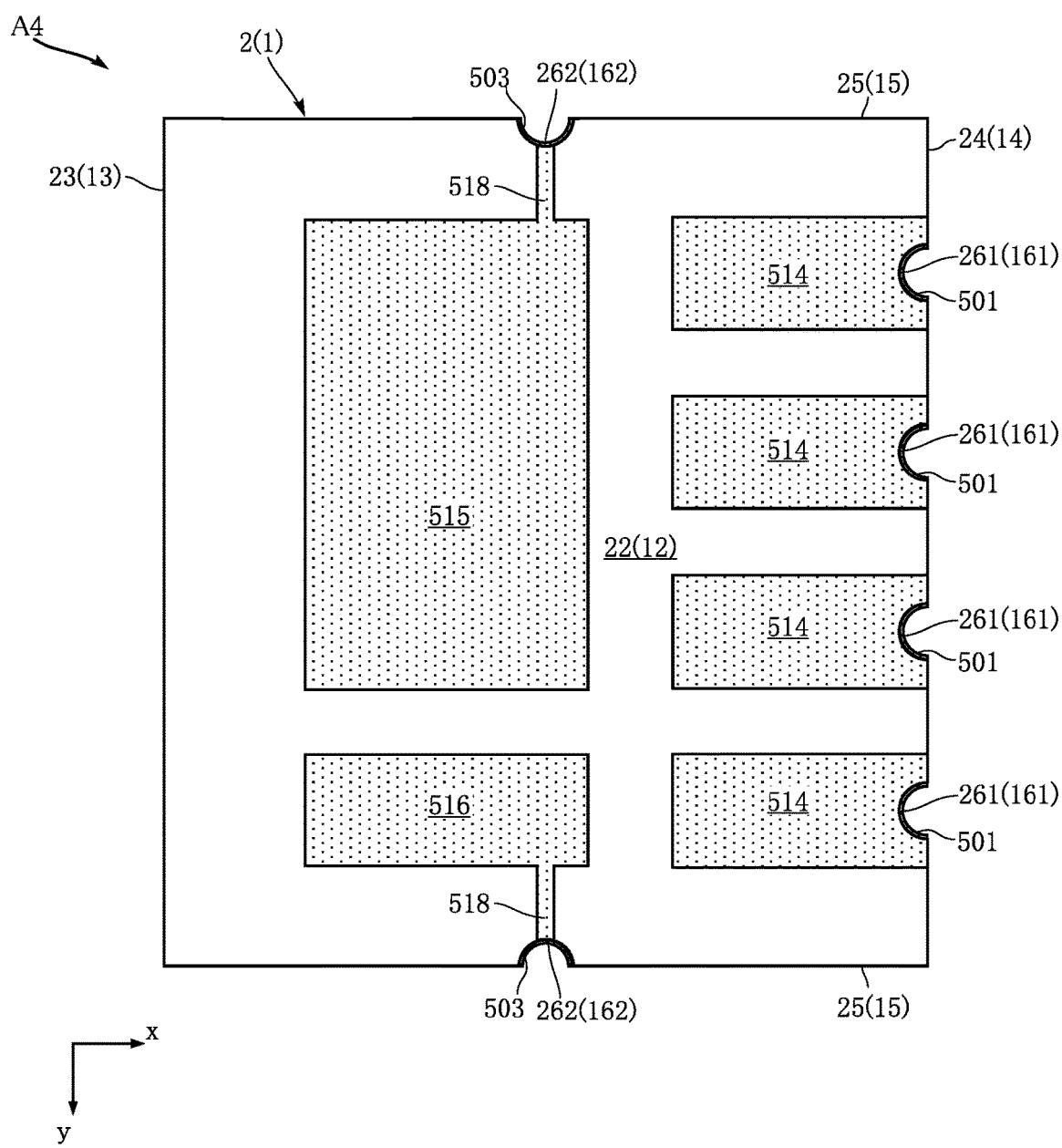
FIG. 30 is a bottom view showing the semiconductor laser device according to the fourth embodiment.
Figure 31:
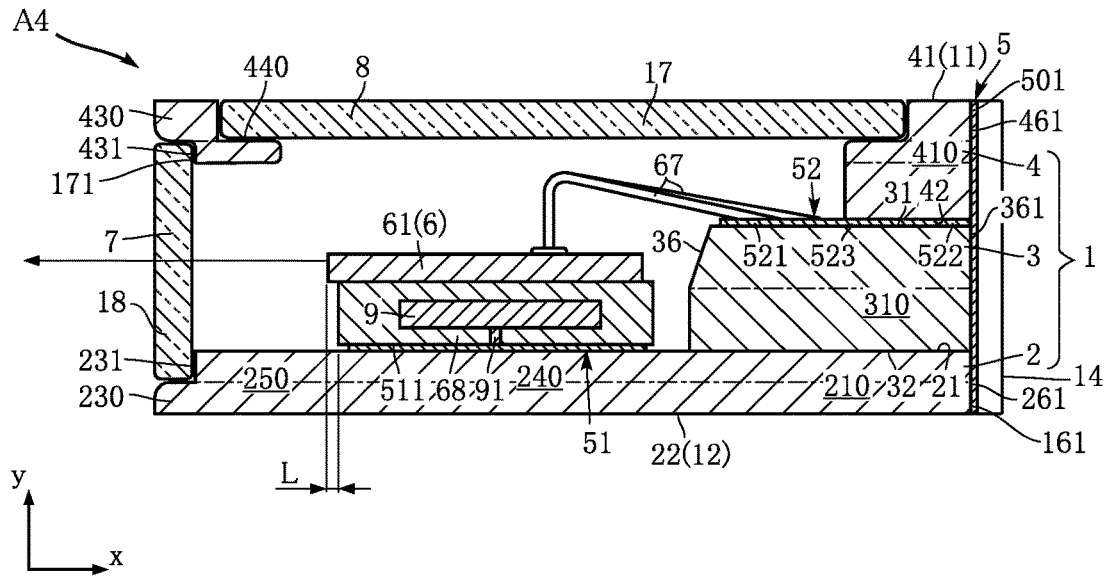
FIG. 31 is a cross-sectional view taken along a line XXXI-XXXI in FIG. 29.
Figure 32:
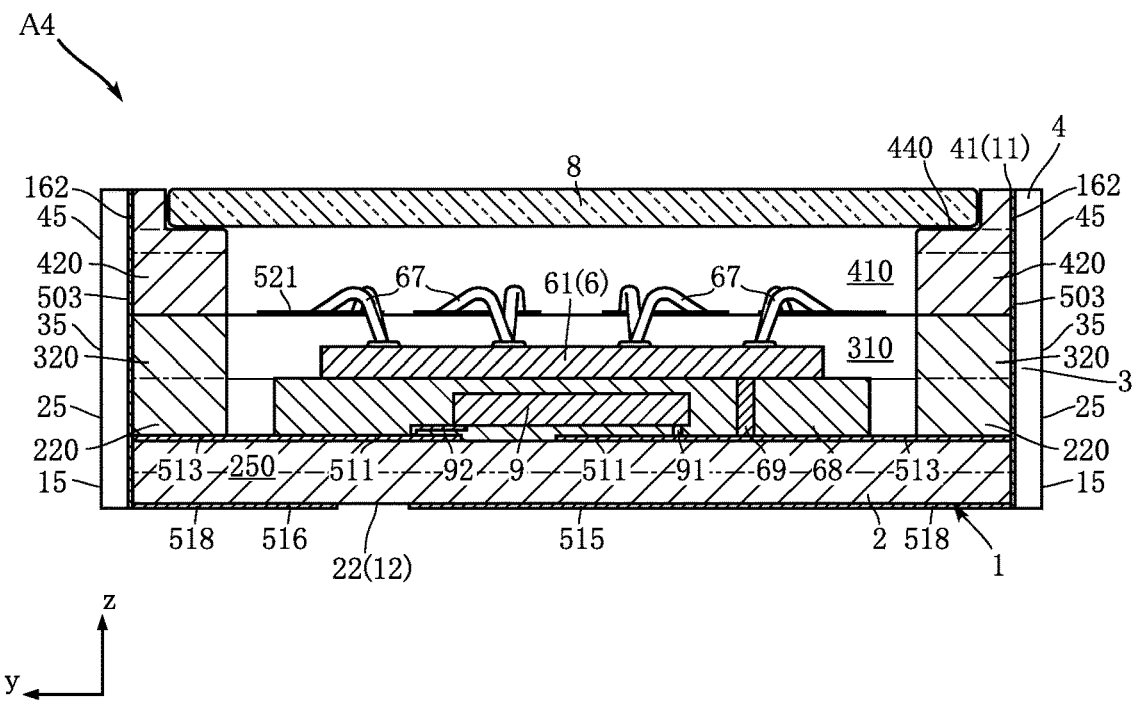
FIG. 32 is a cross-sectional view taken along a line XXXII-XXXII in FIG. 29.

FIG. 29 to FIG. 32 each illustrate a semiconductor laser device according to a fourth embodiment of the present disclosure. FIG. 29 is a plan view showing a semiconductor laser device A4 according to this embodiment. FIG. 30 is a bottom view showing the semiconductor laser device A4. FIG. 31 is a cross-sectional view taken along a line XXXI-XXXI in FIG. 29. FIG. 32 is a cross-sectional view taken along a line XXXII-XXXII in FIG. 29.

In this embodiment, the semiconductor laser device A4 includes a thermistor 9. The thermistor 9 is an example of a temperature detection element for detecting the operating temperature of the semiconductor laser element 6.

In the illustrated example, the thermistor 9 is provided on the submount 68 of the semiconductor laser element 6. As shown in FIG. 32, the submount 68 includes a through wiring 9 and a through wiring 92, in addition to the through wiring 69. The through wiring 91 and the through wiring 92 are formed of a conductive material such as a metal, and each extend from the thermistor 9, and through the submount 68 to the lower face thereof. Here, FIG. 31 and FIG. 32 are schematic representations of the thermistor 9 formed on the submount 68. The specific configuration of thermistor 9 on the submount 68 may be determined in various manners.

As shown in FIG. 30 to FIG. 32, the first wiring portion 51 of the wiring portion 5 includes the pair of element mounting sections 511, the pair of first connecting sections 513, the plurality of mounting terminal sections 514, the mounting terminal section 515, a mounting terminal section 516, and a plurality of first connecting sections 518. In addition, the base material 1 includes a pair of side grooves 162. The pair of side grooves 162 are respectively formed in the pair of side faces 15. The wiring portion 5 includes a pair of side communicating portions 503. The pair of side communicating portions 503 respectively cover the pair of side grooves 162.

The plurality of element mounting sections 511 are formed on the first obverse face 21 of the first layer 2, with a spacing from each other in the y-direction. The through wiring 69 and the through wiring 91 are connected to one of the element mounting sections 511. The through wiring 92 is connected to the other element mounting section 511.

The pair of first connecting sections 513 each extend in the y-direction, from the corresponding element mounting section 511 to the corresponding side groove 162. The pair of first connecting sections 513 are respectively in contact with the pair of side communicating portions 503.

The plurality of mounting terminal sections 514 and the mounting terminal section 515 are configured similarly to the mounting terminal sections 514 and the mounting terminal section 515 of the semiconductor laser device A3. The mounting terminal section 515 is electrically continuous with, for example, the non-illustrated cathode electrode of the thermistor 9, via the first connecting section 518, the side communicating portion 503, the first connecting section 513, the element mounting section 511, and the through wiring 91.

The mounting terminal section 516 is spaced from the mounting terminal section 515 in the y-direction. One of the first connecting sections 518 is connected to the mounting terminal section 516. The first connecting section 518 is in contact with the corresponding side communicating portion 503. As shown in FIG. 32, the mounting terminal section 516 is electrically continuous with, for example, the non-illustrated anode electrode of the thermistor 9, via the first connecting section 518, the side communicating portion 503, the first connecting section 513, the element mounting section 511, and the through wiring 92.

The configuration according to this embodiment also enables the semiconductor laser device A4 to be surface-mounted. In addition, since the thermistor 9 is provided, the operating temperature of the semiconductor laser element 6 can be monitored from outside. Locating the thermistor 9 inside the submount 68 leads to a reduction in size of the semiconductor laser device A4. Utilizing the first reverse face 22 (reverse face 12) as a mounting face also contributes to reducing the size of the semiconductor laser device A4.

Figure 33:
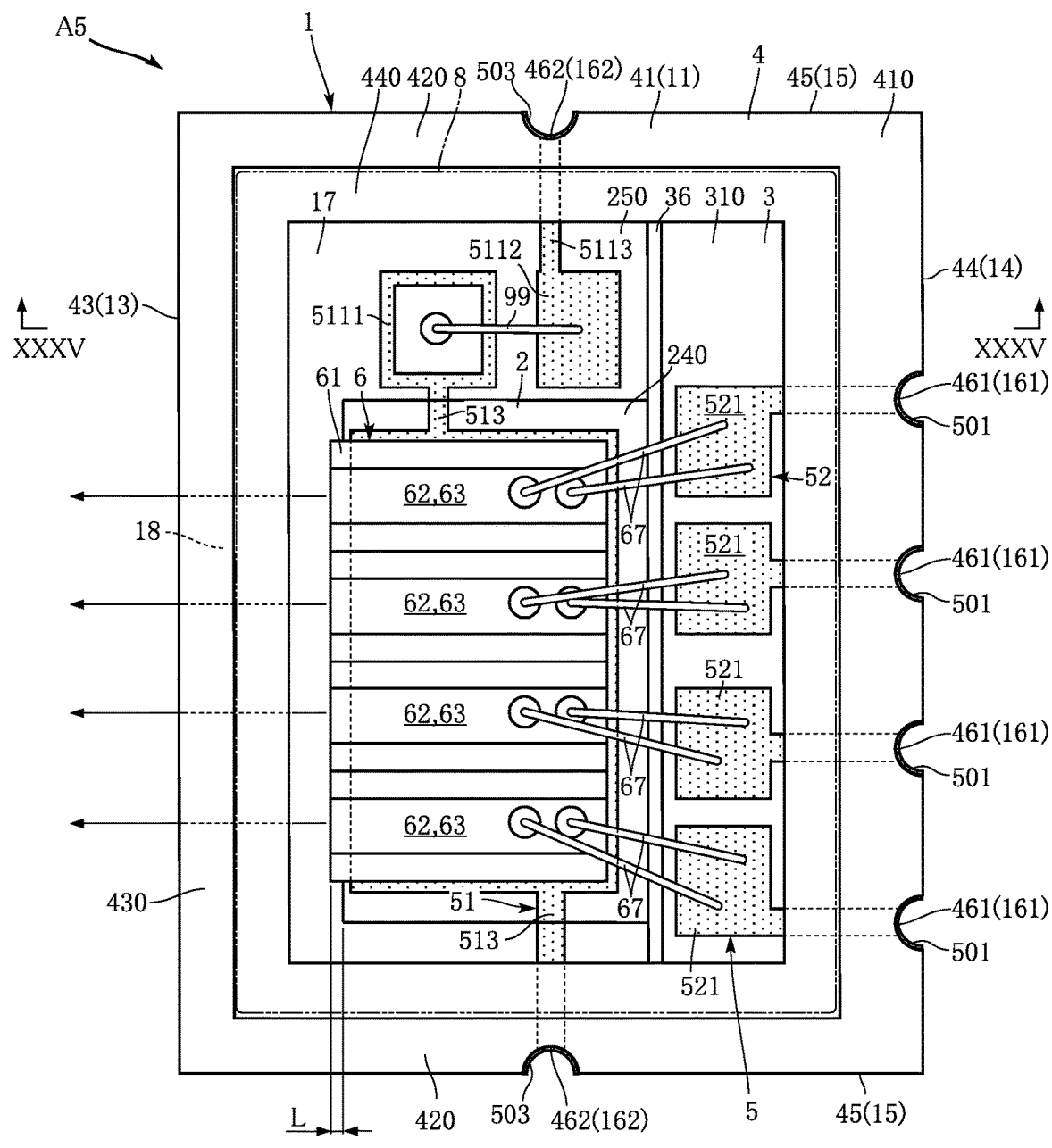
FIG. 33 is a plan view showing a semiconductor laser device according to a fifth embodiment.
Figure 34:
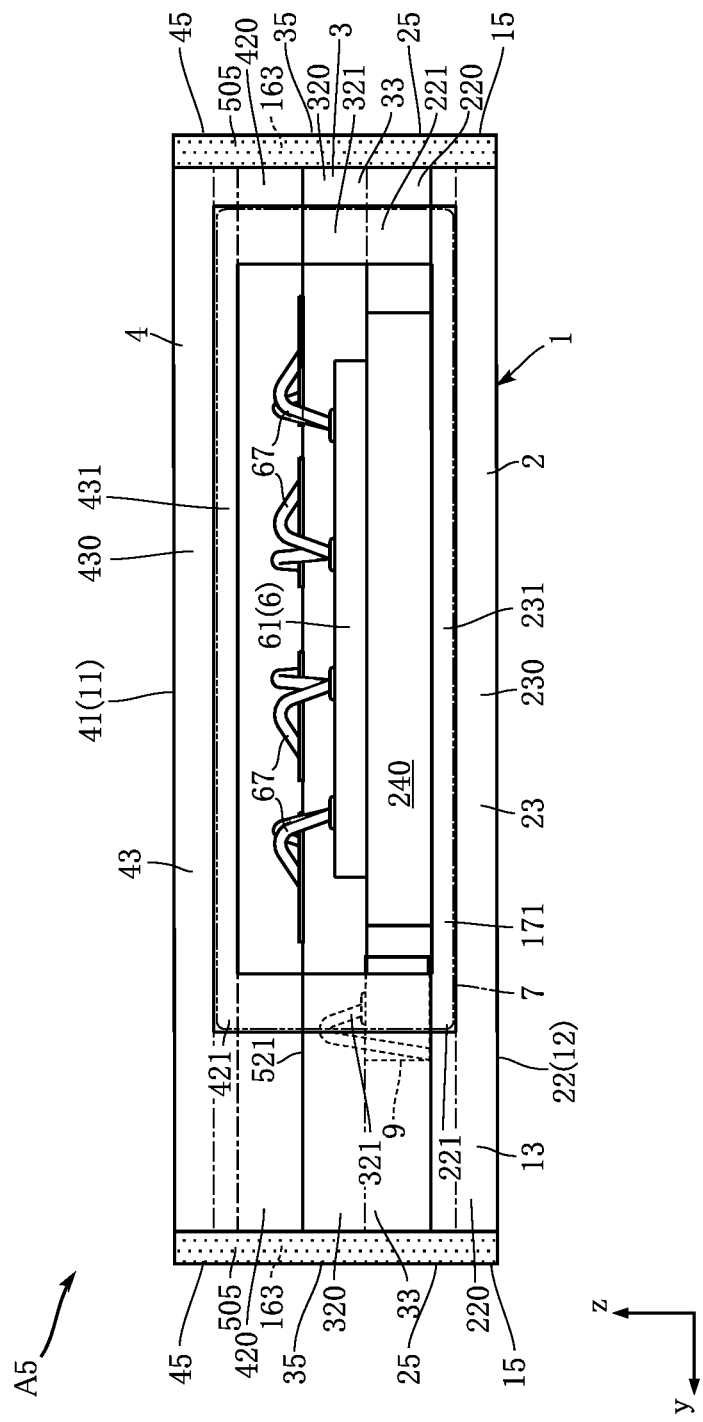
FIG. 34 is a front view showing the semiconductor laser device according to the fifth embodiment.
Figure 35:
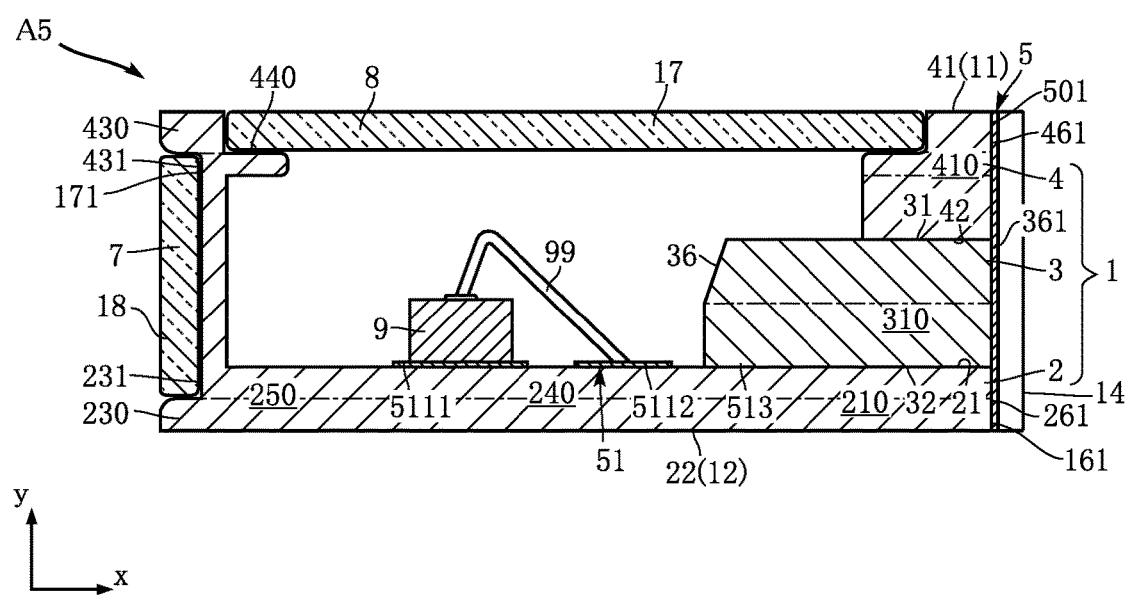
FIG. 35 is a cross-sectional view taken along a line XXXV-XXXV in FIG. 33.

FIG. 33 to FIG. 35 each illustrate a semiconductor laser device according to a fifth embodiment of the present disclosure. FIG. 33 is a plan view showing a semiconductor laser device A5 according to this embodiment. FIG. 34 is a front view showing the semiconductor laser device A5. FIG. 35 is a cross-sectional view taken along a line XXXV-XXXV in FIG. 33.

The semiconductor laser device A5 includes the thermistor 9, like the semiconductor laser device A4. In this embodiment, the thermistor 9 is provided as an element independent from the semiconductor laser element 6. The semiconductor laser element 6 may be with or without the submount 68. In the illustrated example, the semiconductor laser element 6 is without the submount 68. The semiconductor laser element 6 is mounted on the pedestal portion 240 of the first layer 2.

The first wiring portion 51 includes an element mounting section 5111, a wire bonding sections 5112, and a connecting section 5113, in addition to the element mounting section 511 and the first connecting section 513. The element mounting section 5111 is spaced from the element mounting section 511 in the y-direction. The element mounting section 511 and the element mounting section 5111 are connected via the first connecting section 513. The element mounting section 5111 serves as the region for the thermistor 9 to be mounted. The wire bonding sections 5112 is spaced from the element mounting section 5111 in the x-direction. A wire 99 is connected to the wire bonding sections 5112. The wire 99 connects between the thermistor 9 and the wire bonding sections 5112. The connecting section 5113 extends from the wire bonding sections 5112 in the y-direction, to the side groove 162. The connecting section 5113 is in contact with the side communicating portion 503.

The configuration of the reverse face 12 of the semiconductor laser device A5 is, for example, similar to that of the semiconductor laser device A4. As shown in FIG. 33, the thermistor 9 and the wire 99 are exposed in the opening 17 of the base material 1, as viewed in the z-direction. In addition, as shown in FIG. 34, a part of the thermistor 9 protrudes from the emission part 18, and is hidden behind the front end face 13, as viewed in the x-direction.

The configuration according to this embodiment also enables the semiconductor laser device A5 to be surface-mounted. In addition, since the thermistor 9 is provided, the operating temperature of the semiconductor laser element 6 can be monitored from outside. As is apparent from this embodiment, the mounting structure of the thermistor 9 may be designed in various manners, depending on the configuration of the base material 1 and the wiring portion 5.

Figure 36:
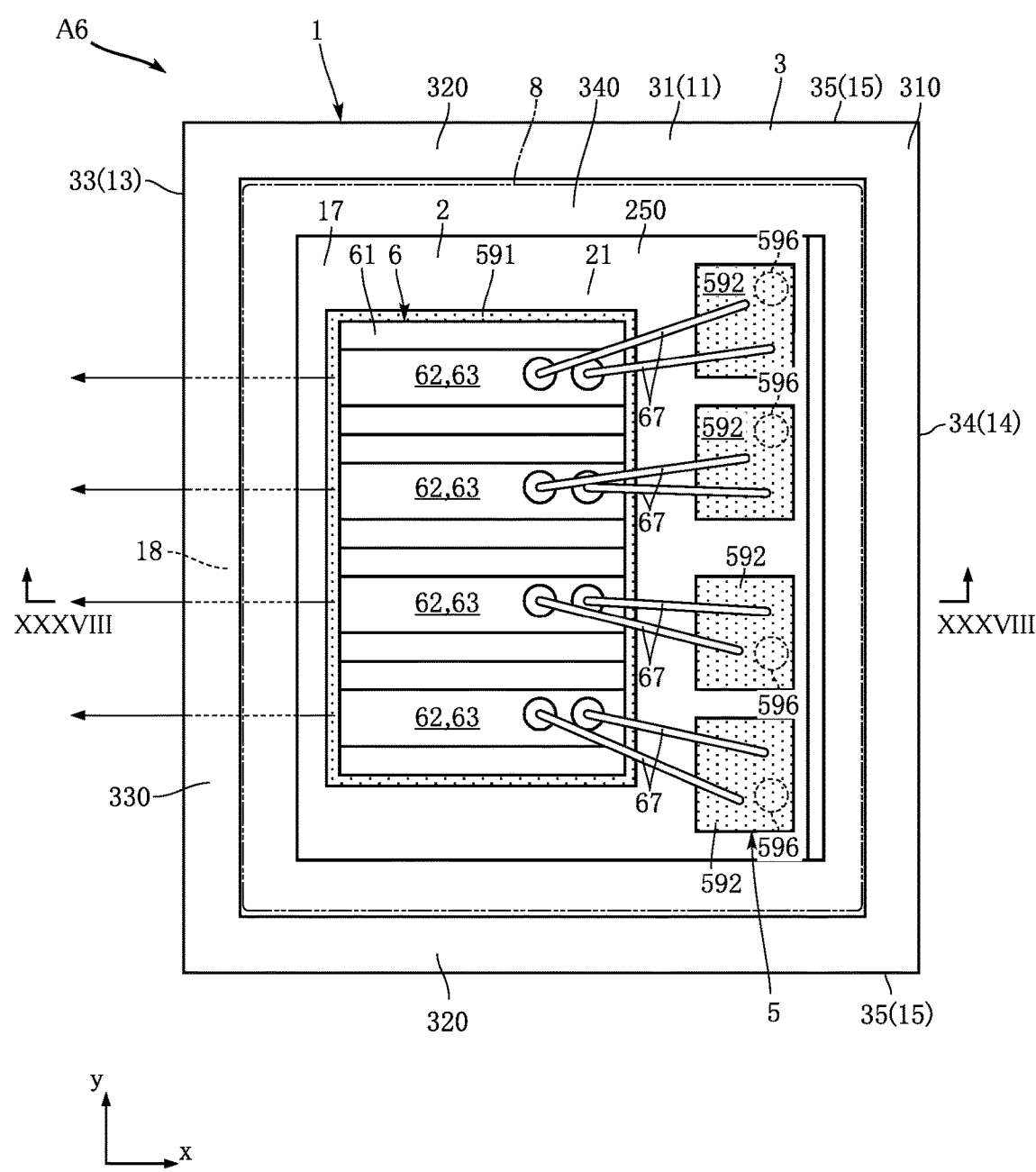
FIG. 36 is a plan view showing a semiconductor laser device according to a sixth embodiment.
Figure 37:
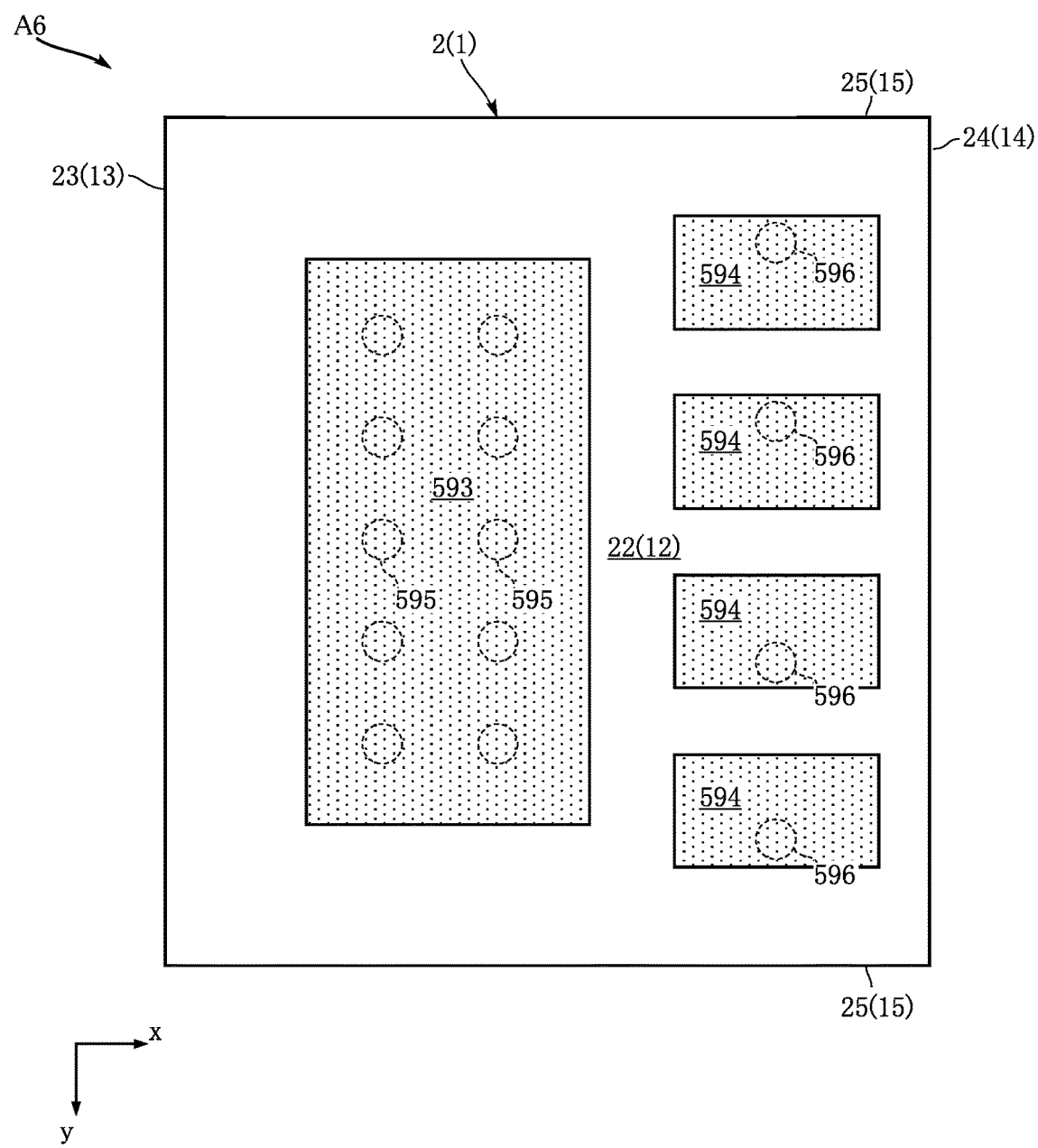
FIG. 37 is a bottom view showing the semiconductor laser device according to the sixth embodiment.
Figure 38:
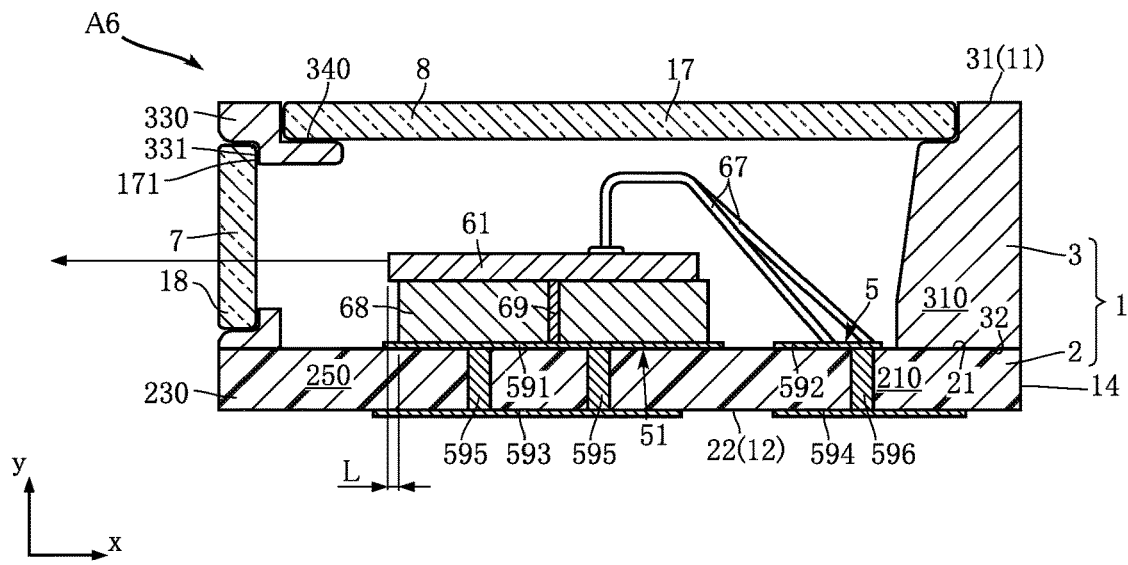
FIG. 38 is a cross-sectional view taken along a line XXXVIII-XXXVIII in FIG. 36.

FIG. 36 to FIG. 38 each illustrate a semiconductor laser device according to a sixth embodiment of the present disclosure. FIG. 36 is a plan view showing a semiconductor laser device A6 according to this embodiment. FIG. 37 is a bottom view showing the semiconductor laser device A6. FIG. 38 is a cross-sectional view taken along a line XXXVIII-XXXVIII in FIG. 36.

In this embodiment, the base material 1 includes the first layer 2 and the second layer 3. The first layer 2 is, for example, formed of a glass epoxy resin in a flat plate shape. The second layer 3 is, for example, formed of an epoxy resin. Thus, the base material 1 may be composed of a plurality of elements of different materials.

The first layer 2 is rectangular as viewed in the z-direction, and includes the first obverse face 21, the first reverse face 22, the first front end face 23, the first rear end face 24, and the pair of first side faces 25. The first reverse face 22 corresponds to the reverse face 12, and serves as a mounting face in this embodiment.

The second layer 3 is formed, for example, by combining a molded epoxy resin to the first layer 2. The second layer 3 includes the opening 17 and the emission part 18 and, in the illustrated example, also includes an annular recess 340 and the front recess 171. The annular recess 340 is similar to the annular recess 440 in the foregoing embodiments, and used to attach the second cover 8.

The wiring portion 5 includes an element mounting section 591, a plurality of wire bonding sections 592, a mounting terminal section 593, a plurality of mounting terminal sections 594, a plurality of through wirings 595, and a plurality of through wirings 596.

The element mounting section 591, on which the semiconductor laser element 6 is mounted, is formed on the first obverse face 21 of the first layer 2. The plurality of wire bonding sections 592 are located on the other side (rear side) of the element mounting section 591 in the x-direction, and aligned in the y-direction with a spacing from each other.

The mounting terminal section 593 is formed on the first reverse face 22 (reverse face 12), so as to overlap with the element mounting section 591, as viewed in the z-direction. The plurality of wire bonding sections 592 are formed on the first reverse face 22 (reverse face 12), so as to respectively overlap with the plurality of wire bonding sections 592, as viewed in the z-direction.

The plurality of through wirings 595, penetrating through the first layer 2 in the z-direction, are formed of a conductive material such as a metal. The plurality of through wirings 595 connect between the element mounting section 591 and the mounting terminal section 593. In the illustrated example, the plurality of through wirings 595 are arranged in a matrix pattern.

The plurality of through wirings 596, penetrating through the first layer 2 in the z-direction, are formed of a conductive material such as a metal. The plurality of through wirings 596 respectively connect between the plurality of wire bonding sections 592 and the plurality of mounting terminal sections 594. As shown in FIG. 36, the through wirings 596 are each located so as to overlap with a portion of the wire bonding section 592 on the other side in the x-direction, as viewed in the z-direction. Such a location is advantageous in bonding the wire 67 at a position distant from the through wiring 596.

The configuration according to this embodiment also enables the semiconductor laser device A6 to be surface-mounted. In addition, providing the through wirings 595 and the through wirings 596 allows the area necessary for arranging the wiring portion 5 to be reduced, which is advantageous in reducing the size of the semiconductor laser device A6. Further, the plurality of through wirings 595 contribute to efficiently transmitting the heat generated from the semiconductor laser element 6 to outside.

Figure 39:
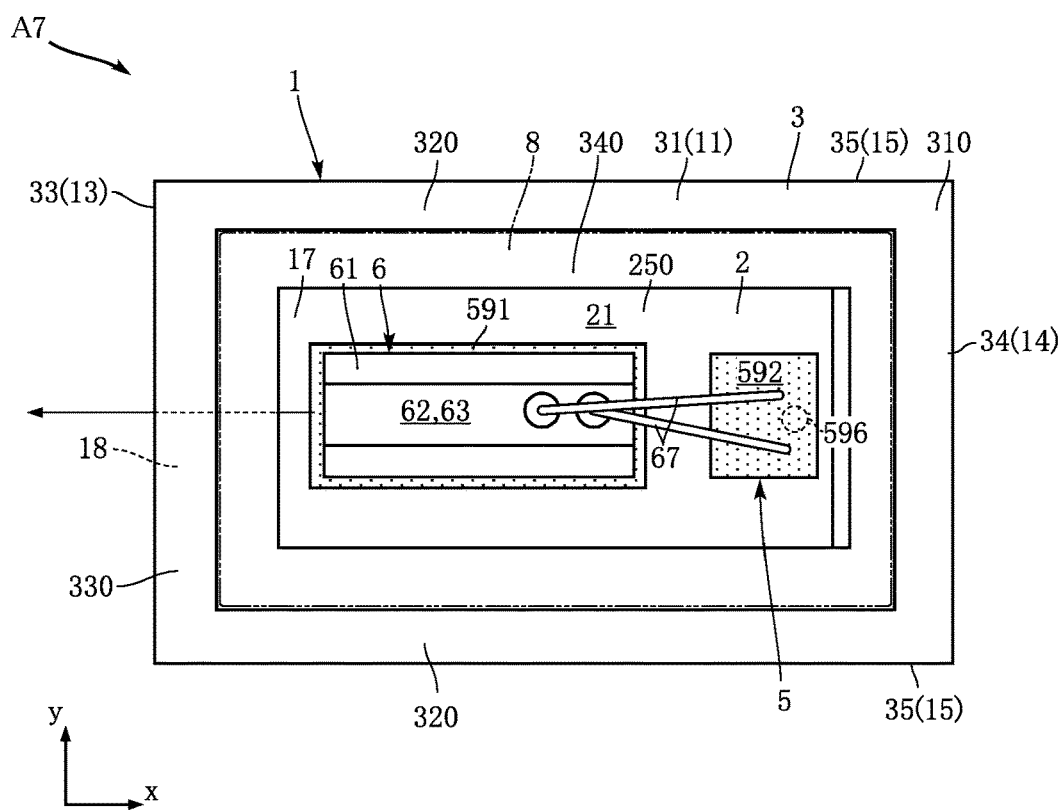
FIG. 39 is a plan view showing a semiconductor laser device according to a seventh embodiment.
Figure 40:
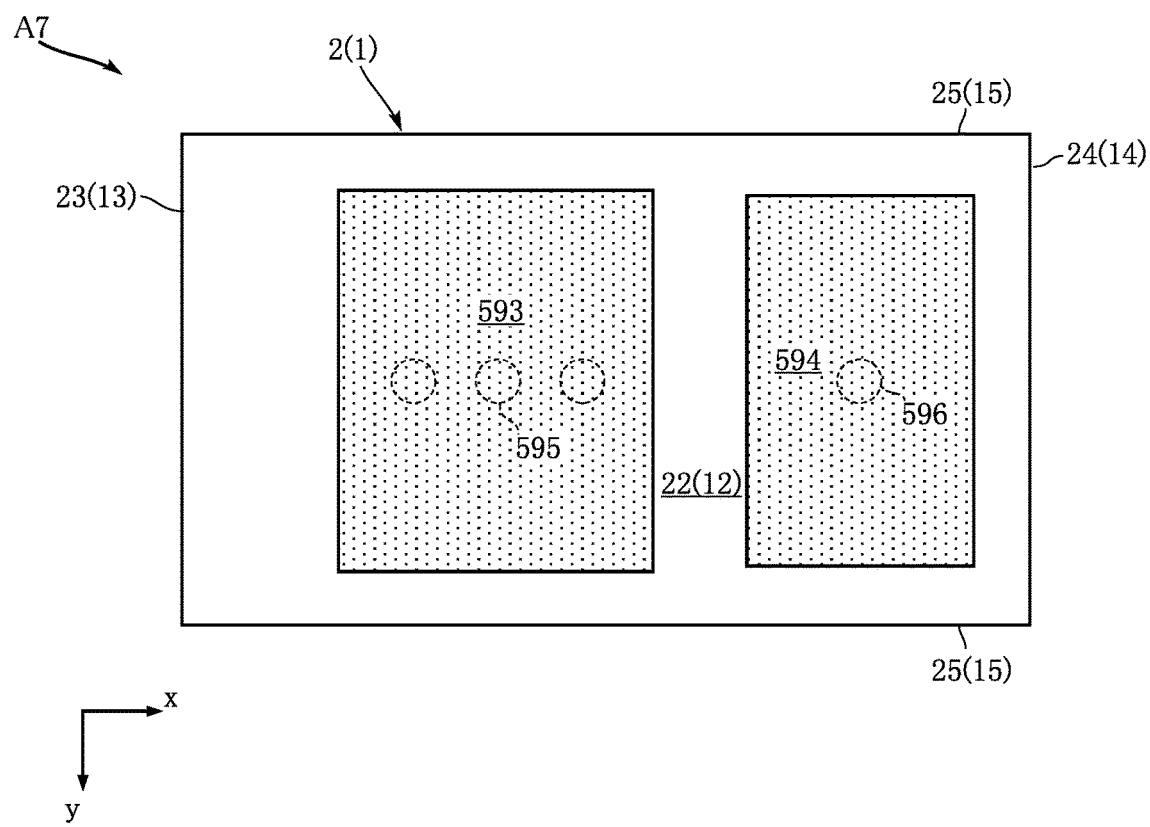
FIG. 40 is a bottom view showing the semiconductor laser device according to the seventh embodiment.

FIG. 39 and FIG. 40 each illustrate a semiconductor laser device according to a seventh embodiment of the present disclosure. FIG. 39 is a plan view showing a semiconductor laser device A7 according to this embodiment. FIG. 40 is a bottom view showing the semiconductor laser device A7.

In this embodiment, the semiconductor laser element 6 only a single waveguide 62 and a single electrode 63. Correspondingly, a single wire bonding section 592 and a single mounting terminal section 594 are provided.

The configuration according to this embodiment also enables the semiconductor laser device A7 to be surface-mounted. In addition, as is apparent from this embodiment, the number of waveguides 62 and the number of electrodes 63 in the semiconductor laser element 6 according to the present disclosure are not specifically limited. The number of waveguides 62 and electrodes 63 may be one each, or two or more each except four. Further, for example when it is unnecessary to emit the laser light at different timings from the plurality of waveguides 62 of the semiconductor laser device A1, the number of mounting terminal sections 531 may be just one.

The semiconductor laser device according to the present disclosure is not limited to the foregoing embodiments. The specific configuration of the elements of the semiconductor laser device according to the present disclosure may be modified in various manners.

Clause 1. A semiconductor laser device comprising:
a semiconductor laser element;
a base material supporting the semiconductor laser element; and
a wiring portion formed on the base material and constituting a conduction path to the semiconductor laser element,
wherein the base material includes: a mounting face oriented to one side in a thickness direction of the base material, the semiconductor laser element being mounted on the mounting face; and an emission part located on one side with respect to the semiconductor laser element in a first direction perpendicular to the thickness direction, and
light from the semiconductor laser element is emitted out through the emission part.

Clause 2. The semiconductor laser device according to clause 1, wherein the base material includes an opening located on the one side in the thickness direction with respect to the semiconductor laser element.

Clause 3. The semiconductor laser device according to clause 2, wherein the emission part is provided with a first cover that transmits light from the semiconductor laser element.

Clause 4. The semiconductor laser device according to clause 3, wherein the first cover includes a lens portion that refracts the light from the semiconductor laser element.

Clause 5. The semiconductor laser device according to any one of clauses 2 to 4, further comprising a second cover that covers the opening.

Clause 6. The semiconductor laser device according to any one of clauses 2 to 5, wherein the base material includes a mounting face oriented in the thickness direction, and the wiring portion includes a mounting terminal section formed on the mounting face.

Clause 7. The semiconductor laser device according to clause 6, wherein the mounting face is oriented to the one side in the thickness direction.

Clause 8. The semiconductor laser device according to clause 6, wherein the mounting face is oriented to another side in the thickness direction.

Clause 9. The semiconductor laser device according to clause 8, wherein the wiring portion includes an element mounting section formed on the mounting face, and the semiconductor laser element is mounted on the element mounting section.

Clause 10. The semiconductor laser device according to clause 9, wherein the base material includes: a rear end face oriented to another side in the first direction and reaching the mounting face; and at least one rear groove recessed from the rear end face and reaching the mounting face, and
the wiring portion includes at least one rear communicating portion formed on the rear groove and electrically connecting the semiconductor laser element and the mounting terminal section to each other.

Clause 11. The semiconductor laser device according to clause 10, wherein the base material includes: a bottom portion located on the another side in the thickness direction with respect to the mounting face; and a pedestal portion protruding from the bottom portion to the one side in the thickness direction and forming the mounting face.

Clause 12. The semiconductor laser device according to clause 10, wherein the semiconductor laser element includes a semiconductor layer having a light emitting function, and a submount supporting the semiconductor layer.

Clause 13. The semiconductor laser device according to clause 11 or 12, wherein the base material includes an inner end face located on the another side in the first direction with respect to the semiconductor laser element and inclined with respect to the thickness direction.

Clause 14. The semiconductor laser device according to any one of clauses 11 to 13, further comprising a wire, wherein the wiring portion includes at least one wire bonding section that is located on the another side in the first direction with respect to the semiconductor laser element and located on the one side in the thickness direction with respect to the mounting face, and
the wire is connected to the semiconductor laser element and the wire bonding section.

Clause 15. The semiconductor laser device according to clause 14, wherein the semiconductor laser element includes a plurality of waveguides aligned in a second direction perpendicular to the first direction and the thickness direction, the waveguides being capable of emitting light independently of each other to the one side in the first direction.

Clause 16. The semiconductor laser device according to clause 15, wherein the at least one rear groove includes a plurality of rear grooves aligned in the second direction,
the at least one wire bonding section includes a plurality of wire bonding sections aligned in the second direction,
the at least one rear communicating portion includes a plurality of rear communicating portions formed in the plurality of rear grooves, respectively,
the wiring portion includes a plurality of second strip sections each electrically connecting one of the plurality of wire bonding sections and one of the plurality of rear communicating portions to each other, and
the plurality of second strip sections are aligned in the second direction and each extend in the first direction.

Clause 17. The semiconductor laser device according to any one of clauses 1 to 16, further comprising a temperature detection element, supported by the base material and electrically continuous with the wiring portion.

The invention claimed is:

1. A semiconductor laser device comprising:
a semiconductor laser element;
a base material supporting the semiconductor laser element; and
a wiring portion formed on the base material and constituting a conduction path to the semiconductor laser element,
wherein the base material includes: a mounting face oriented to one side in a thickness direction of the base material, the semiconductor laser element being mounted on the mounting face; and an emission part located on one side with respect to the semiconductor laser element in a first direction perpendicular to the thickness direction,
light from the semiconductor laser element is emitted out through the emission part,
the base material includes an opening located on the one side in the thickness direction with respect to the semiconductor laser element,
the base material includes a mounting face oriented in the thickness direction,
the wiring portion includes a mounting terminal section formed on the mounting face,
the wiring portion includes an element mounting section formed on the mounting face, and the semiconductor laser element is mounted on the element mounting section,
the base material includes: a rear end face oriented to another side in the first direction and reaching the mounting face; and at least one rear groove recessed from the rear end face and reaching the mounting face, and
the wiring portion includes at least one rear communicating portion formed on the rear groove and electrically connecting the semiconductor laser element and the mounting terminal section to each other.

2. The semiconductor laser device according to claim 1, wherein the emission part is provided with a first cover that transmits light from the semiconductor laser element.

3. The semiconductor laser device according to claim 2, wherein the first cover includes a lens portion that refracts the light from the semiconductor laser element.

4. The semiconductor laser device according to claim 1, further comprising a second cover that covers the opening.

5. The semiconductor laser device according to claim 1, wherein the mounting face is oriented to the one side in the thickness direction.

6. The semiconductor laser device according to claim 1, wherein the mounting face is oriented to another side in the thickness direction.

7. The semiconductor laser device according to claim 6, wherein the base material includes: a bottom portion located on the another side in the thickness direction with respect to the mounting face; and a pedestal portion protruding from the bottom portion to the one side in the thickness direction and forming the mounting face.

8. The semiconductor laser device according to claim 7, wherein the base material includes an inner end face located on the another side in the first direction with respect to the semiconductor laser element and inclined with respect to the thickness direction.

9. The semiconductor laser device according to claim 7, further comprising a wire, wherein the wiring portion includes at least one wire bonding section that is located on the another side in the first direction with respect to the semiconductor laser element and located on the one side in the thickness direction with respect to the mounting face, and
the wire is connected to the semiconductor laser element and the wire bonding section.

10. The semiconductor laser device according to claim 9, wherein the semiconductor laser element includes a plurality of waveguides aligned in a second direction perpendicular to the first direction and the thickness direction, the waveguides being capable of emitting light independently of each other to the one side in the first direction.

11. The semiconductor laser device according to claim 10, wherein the at least one rear groove includes a plurality of rear grooves aligned in the second direction,
the at least one wire bonding section includes a plurality of wire bonding sections aligned in the second direction,
the at least one rear communicating portion includes a plurality of rear communicating portions formed in the plurality of rear grooves, respectively,
the wiring portion includes a plurality of second strip sections each electrically connecting one of the plurality of wire bonding sections and one of the plurality of rear communicating portions to each other, and
the plurality of second strip sections are aligned in the second direction and each extend in the first direction.

12. The semiconductor laser device according to claim 6, wherein the semiconductor laser element includes a semiconductor layer having a light emitting function, and a submount supporting the semiconductor layer.

13. The semiconductor laser device according to claim 1, further comprising a temperature detection element, supported by the base material and electrically continuous with the wiring portion.

* * * * *